(12) United States Patent
Onaka

(10) Patent No.: US 9,231,366 B2
(45) Date of Patent: Jan. 5, 2016

(54) OPTICAL TRANSMITTING DEVICE AND OPTICAL TRANSMISSION SYSTEM

(71) Applicant: FUJITSU LIMITED, Kawasaki-shi, Kanagawa (JP)

(72) Inventor: Miki Onaka, Kawasaki (JP)

(73) Assignee: FUJITSU LIMITED, Kawasaki (JP)

(*) Notice: Subject to any disclaimer, the term of this patent is extended or adjusted under 35 U.S.C. 154(b) by 165 days.

(21) Appl. No.: 14/088,713

(22) Filed: Nov. 25, 2013

(65) Prior Publication Data

US 2014/0270752 A1    Sep. 18, 2014

(30) Foreign Application Priority Data

Mar. 18, 2013  (JP) .................................. 2013-055693

(51) Int. Cl.
| | |
|---|---|
| *H01S 5/00* | (2006.01) |
| *G01R 31/26* | (2014.01) |
| *H04B 10/077* | (2013.01) |
| *H04B 10/50* | (2013.01) |

(52) U.S. Cl.
CPC .......... *H01S 5/0021* (2013.01); *G01R 31/2635* (2013.01); *G01R 31/2642* (2013.01); *H01S 5/0014* (2013.01); *H04B 10/0779* (2013.01); *H04B 10/50* (2013.01)

(58) Field of Classification Search
CPC . H01S 5/0014; H01S 5/0021; G01R 31/2635; G01R 31/2642
See application file for complete search history.

(56) References Cited

U.S. PATENT DOCUMENTS

| | | | | |
|---|---|---|---|---|
| 6,249,140 | B1* | 6/2001 | Shigihara | 324/750.03 |
| 8,294,484 | B1* | 10/2012 | Thiyagarajan | 324/762.01 |
| 2007/0030176 | A1* | 2/2007 | Sanchez-Olea et al. | 341/13 |
| 2012/0236396 | A1* | 9/2012 | Tamura | 359/337 |

FOREIGN PATENT DOCUMENTS

| | | |
|---|---|---|
| JP | 9-18412 | 1/1997 |
| JP | 2005-197984 | 7/2005 |

OTHER PUBLICATIONS

NEC Electronics Corporation, "Technical Note PQ10478JJ02V0TN (second version)", Optical Microwave Semiconductors, Quality/Reliability Handbook, pp. 69-134, Chapter 3, 2006.

* cited by examiner

*Primary Examiner* — Yuanda Zhang
(74) *Attorney, Agent, or Firm* — Staas & Halsey LLP

(57) ABSTRACT

An optical transmitting device includes: a laser diode to which a first or second driving current is provided; a controller to provide the laser diode with the first driving current to transmit an optical signal and with a plurality of second driving currents, to emit light, different from each other in magnitude during a stop of providing the first driving current; a measuring unit to measure an intensity of the light emitted by the laser diode; a calculator to calculate a threshold current of the laser diode, based on the intensities corresponding to the plurality of second driving currents measured by the measuring unit and magnitudes of the plurality of second driving currents; and a determination unit to determine a precursor of a sudden-death of the laser diode, based on an amount of variation in the threshold current calculated by the calculator during a specific period.

16 Claims, 27 Drawing Sheets

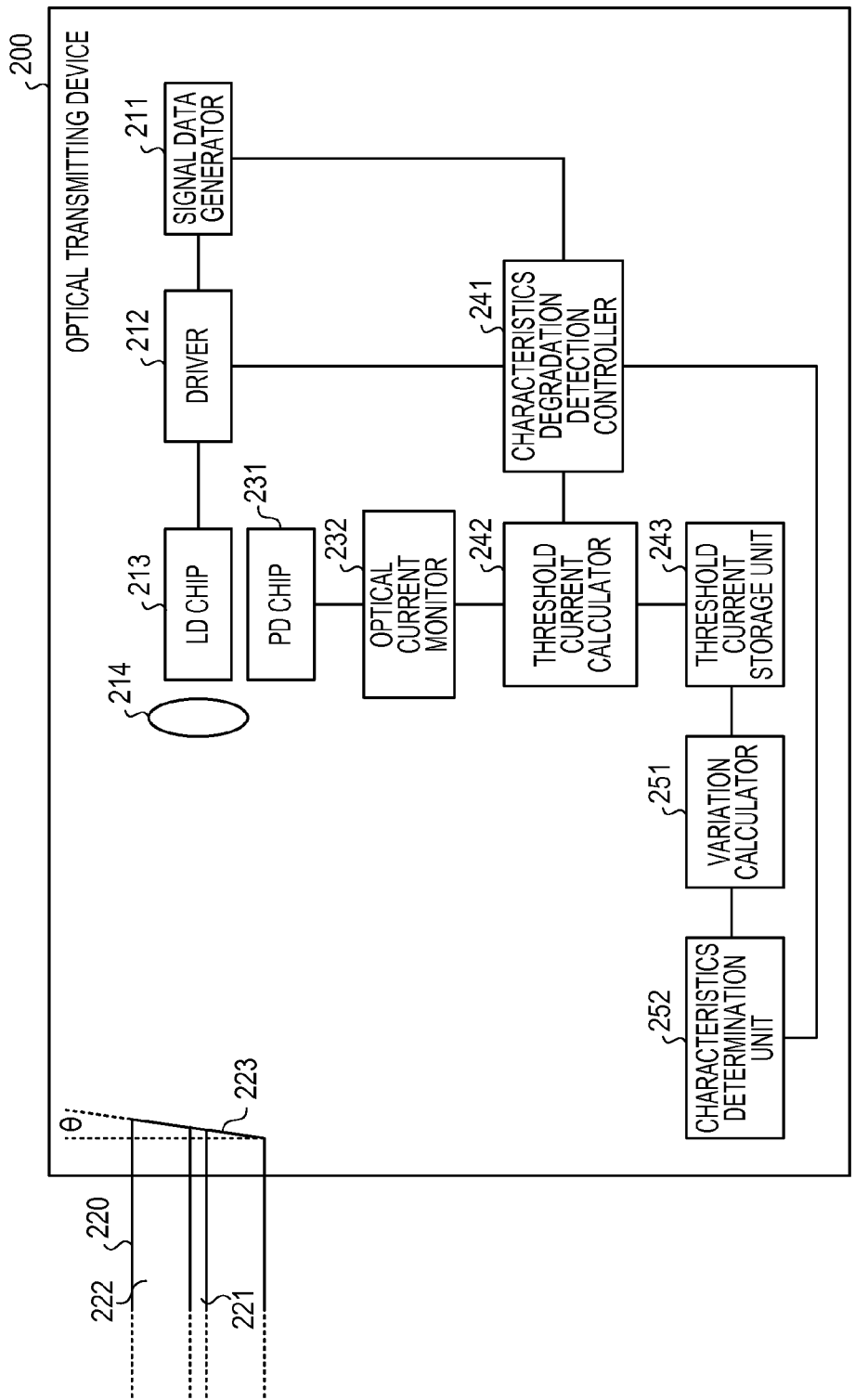

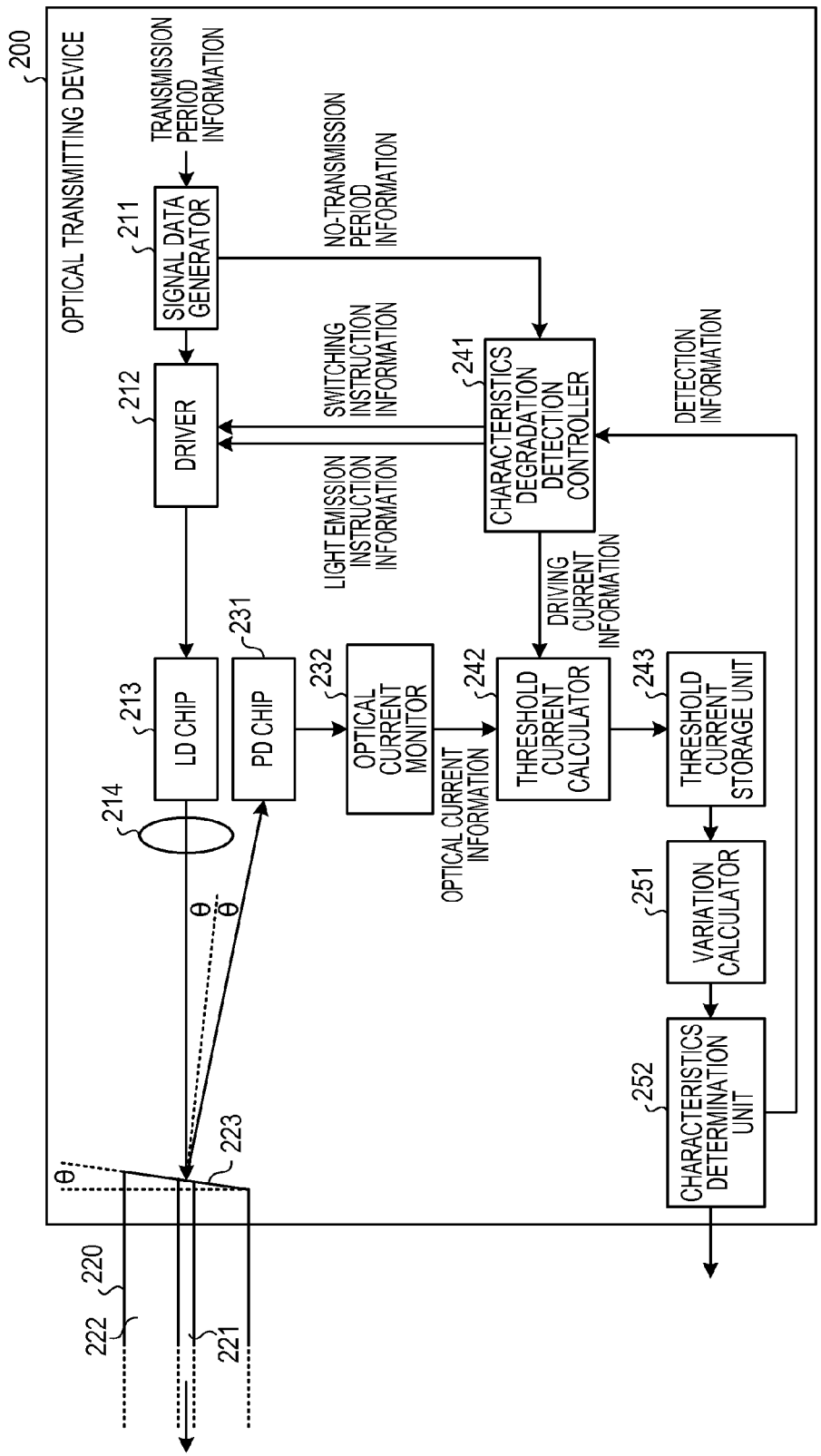

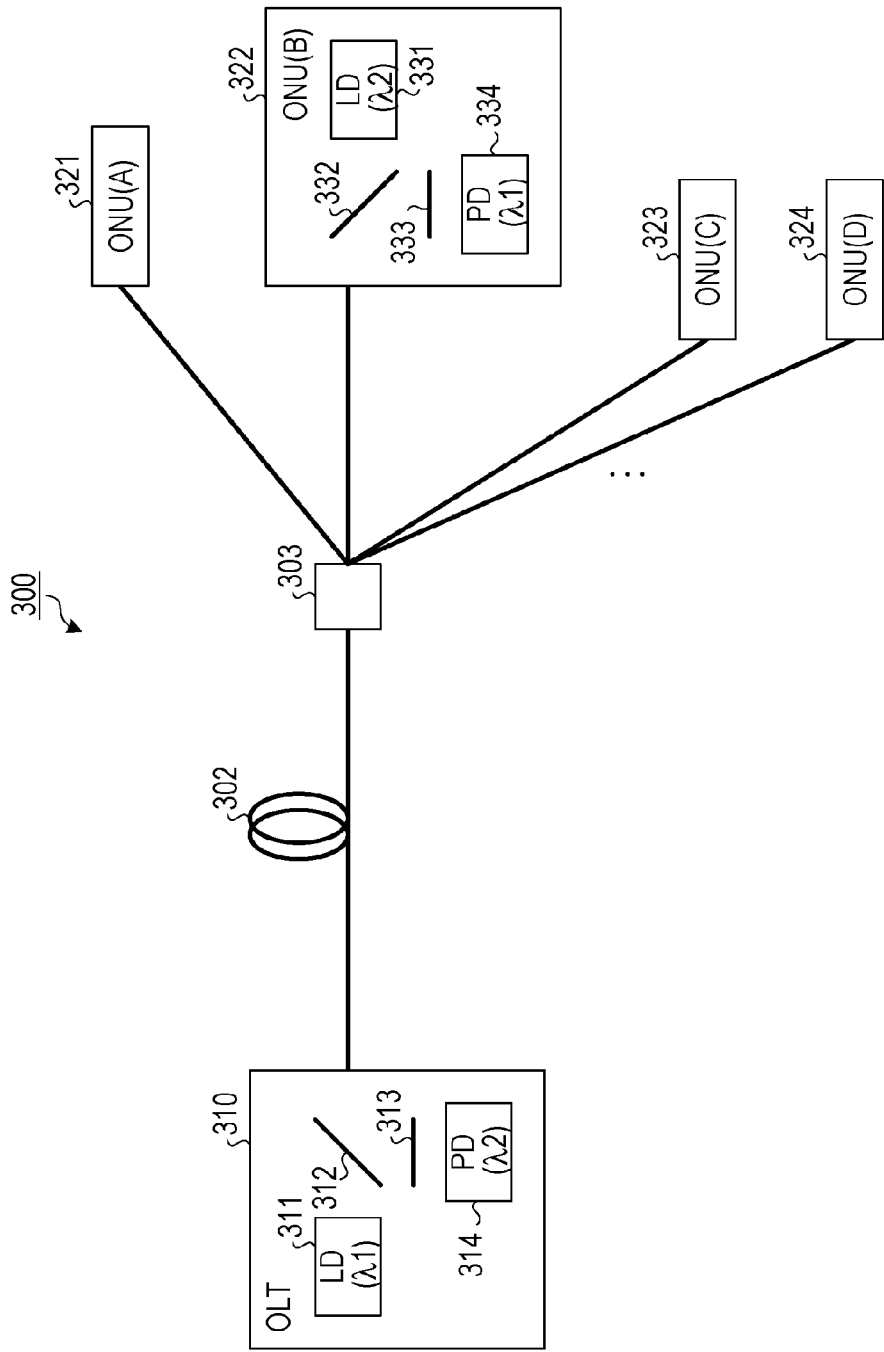

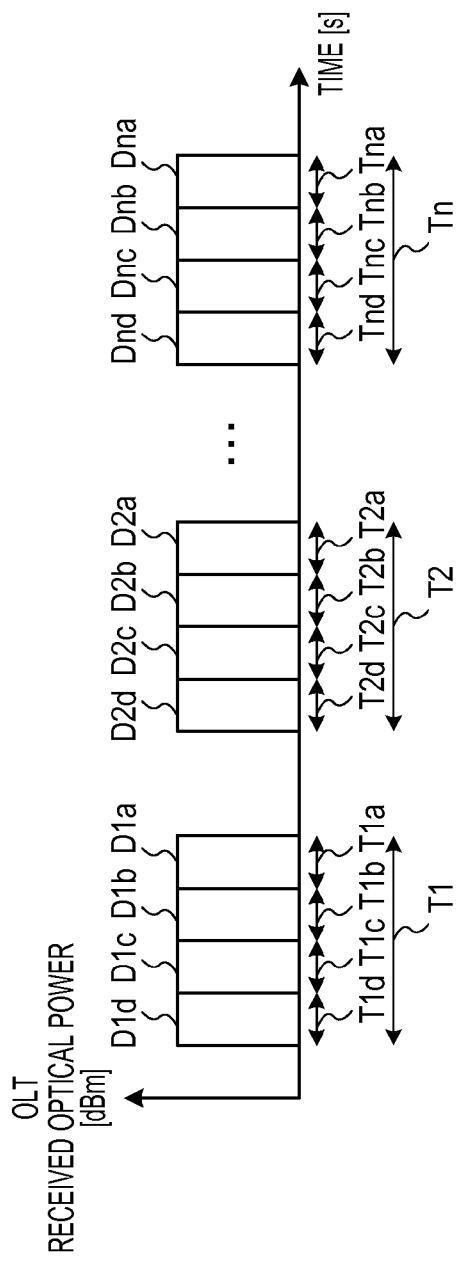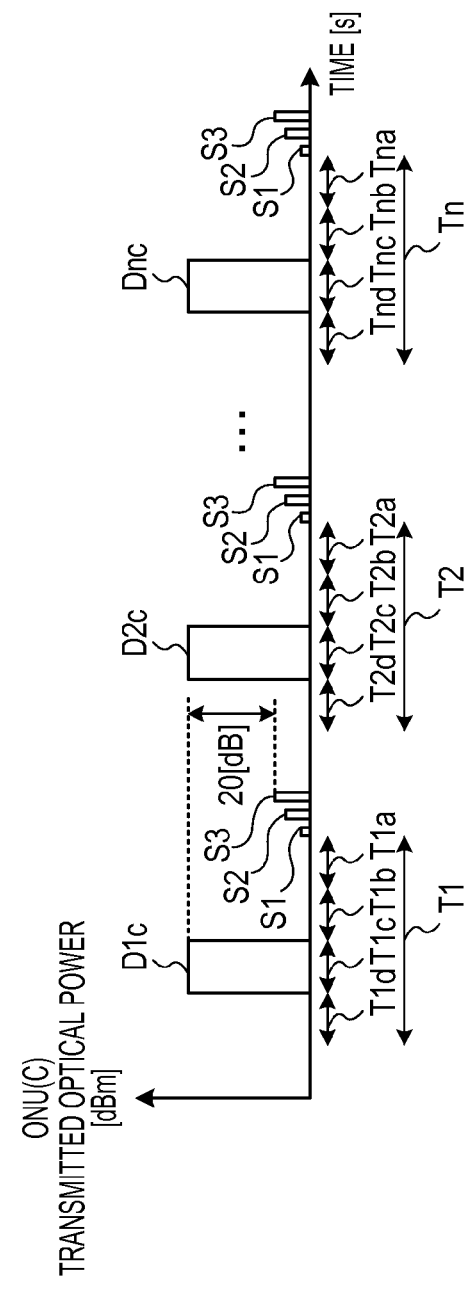

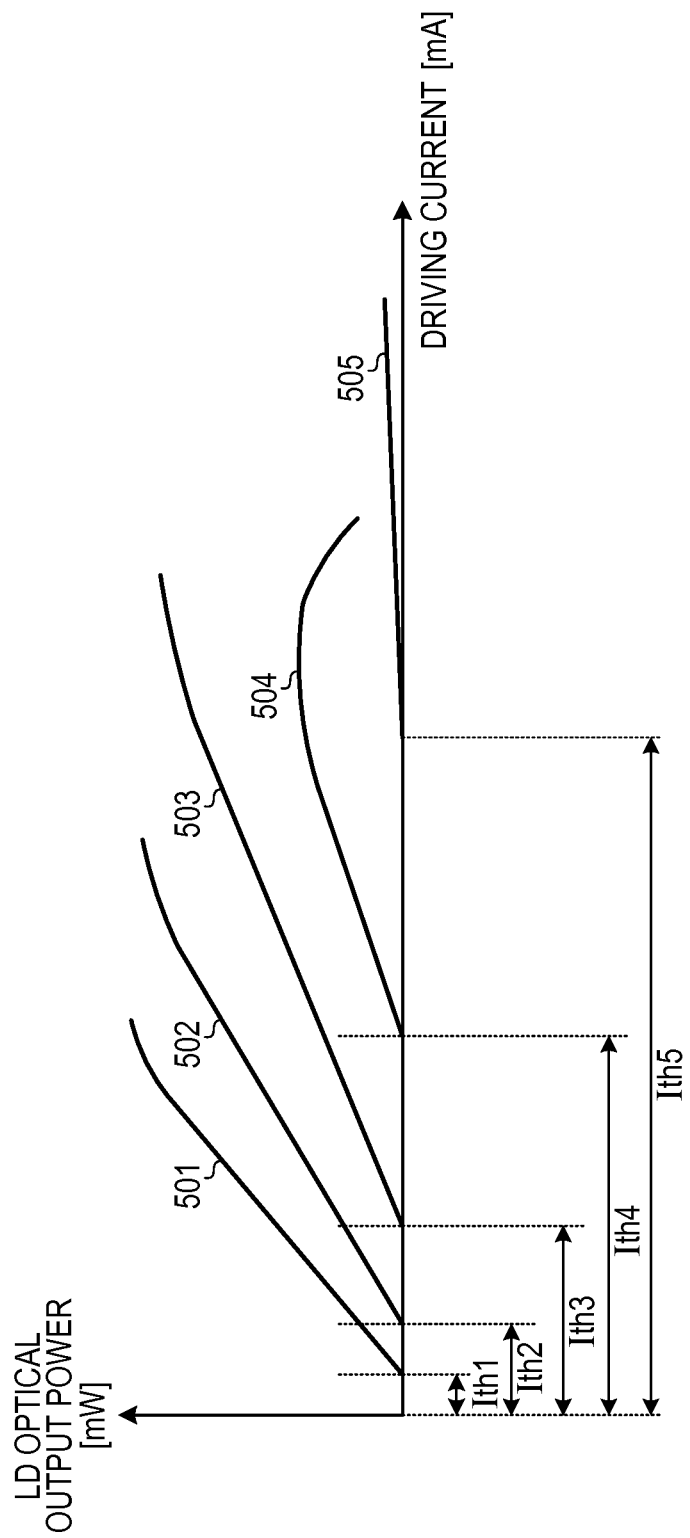

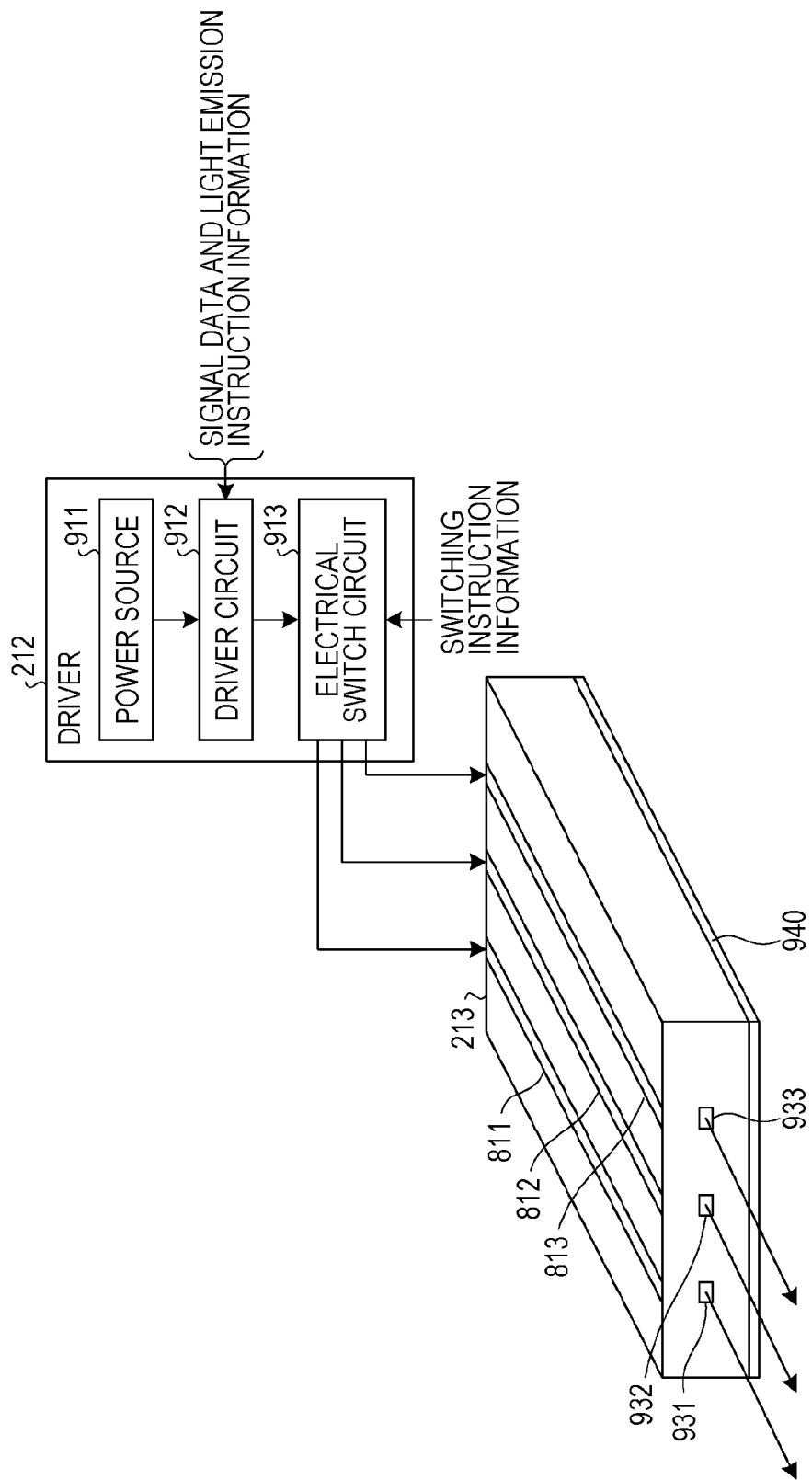

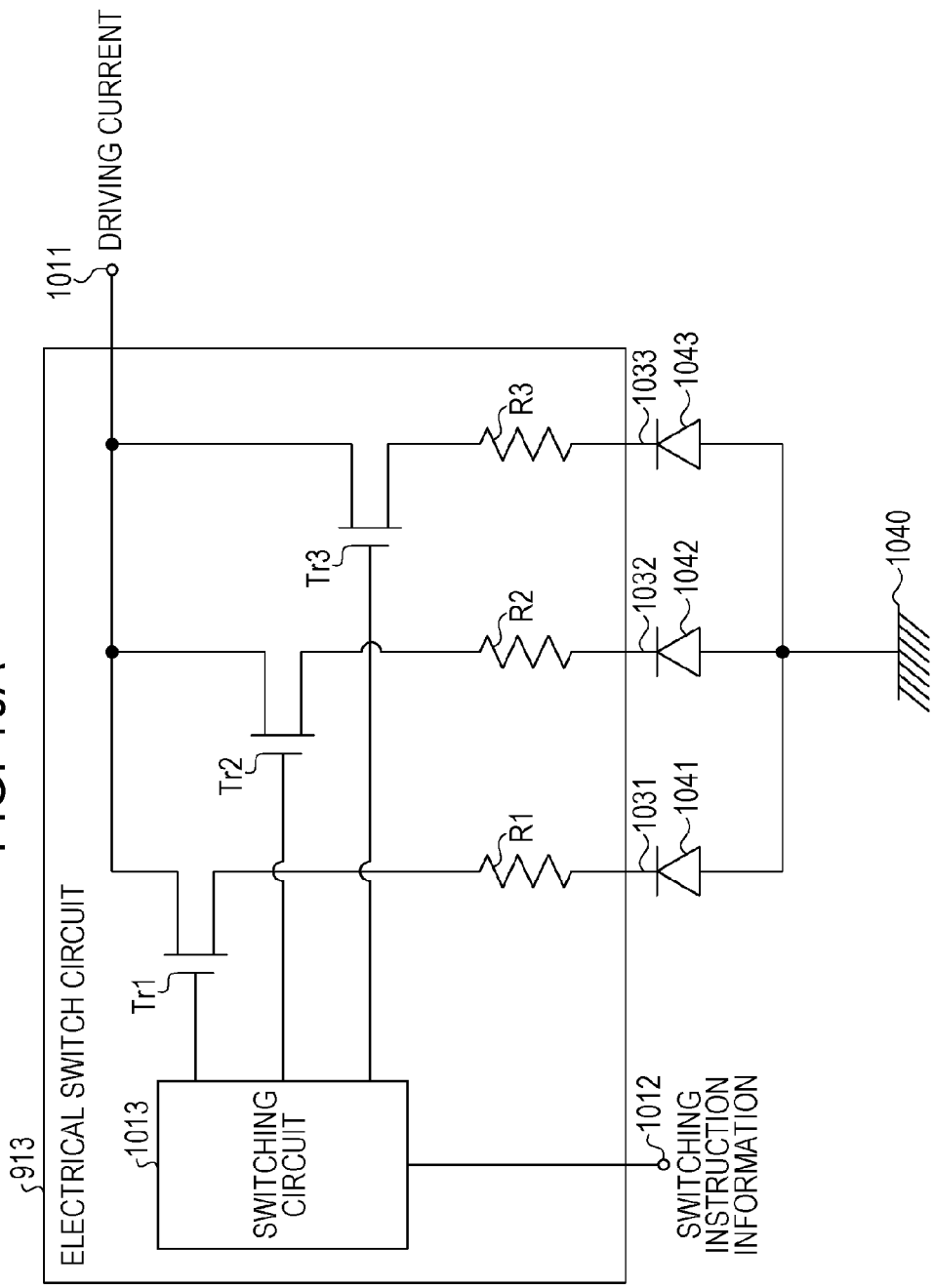

FIG. 10B

|  | Tr1 | Tr2 | Tr3 |
|---|---|---|---|
| STATE 1 | H | L | L |
| STATE 2 | L | H | L |
| STATE 3 | L | L | H |

1050

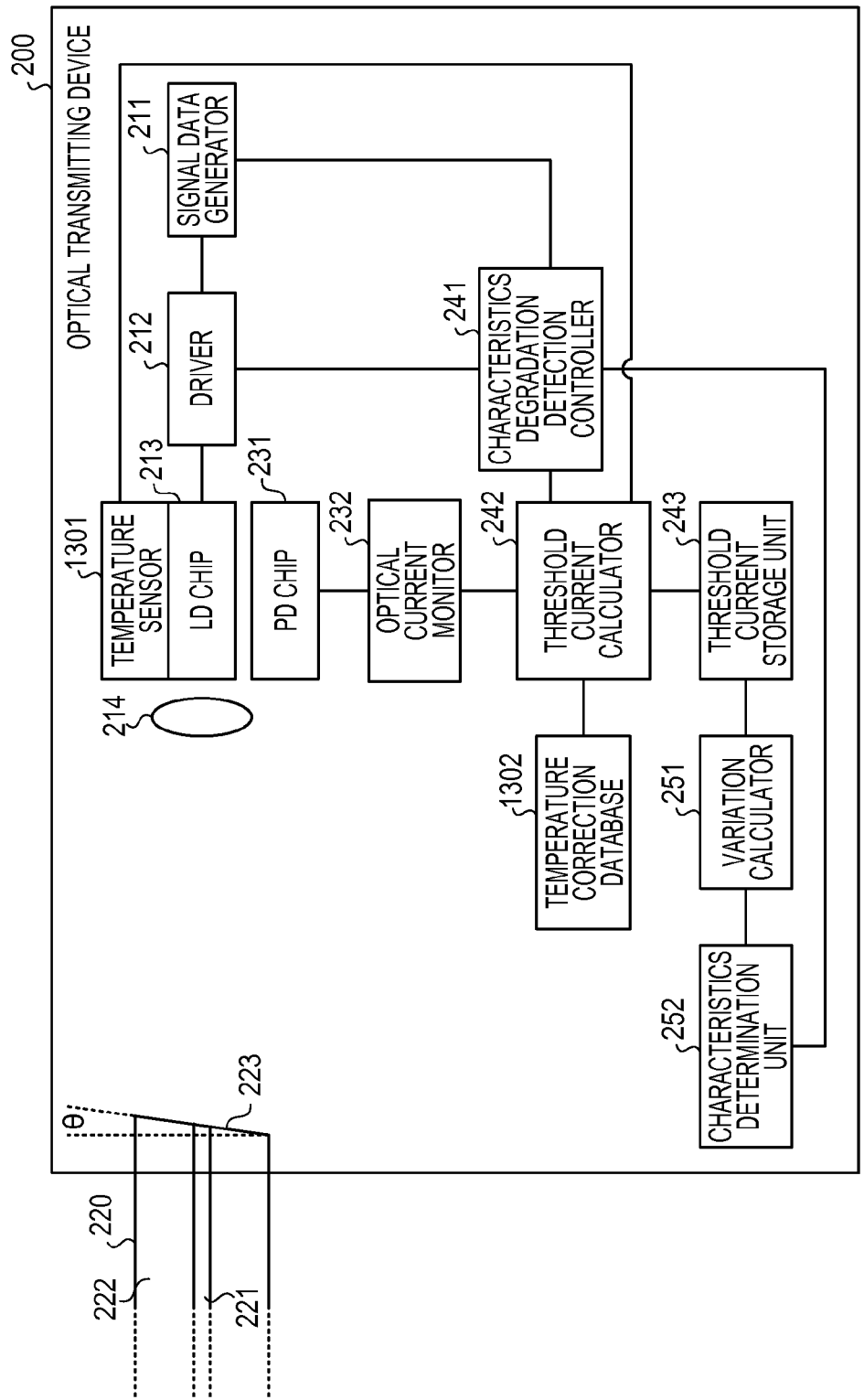

| DRIVING CURRENT [mA] | OPTICAL POWER [mW] | | | |
|---|---|---|---|---|
| | 40 [DEGREES C] | 50 [DEGREES C] | 60 [DEGREES C] | 70 [DEGREES C] |
| 0 | 0 | 0 | 0 | 0 |
| 2 | A1 | A2 | A3 | A4 |
| 4 | B1 | B2 | B3 | B4 |
| 6 | C1 | C2 | C3 | C4 |
| 8 | D1 | D2 | D3 | D4 |
| 10 | E1 | E2 | E3 | E4 |
| ⋮ | ⋮ | ⋮ | ⋮ | ⋮ |

| TEMPERATURE [DEGREES C] | THRESHOLD CURRENT |
|---|---|
| 0 | A |
| 10 | B |
| 20 | C |
| 30 | D |
| 40 | E |
| 50 | F |
| 60 | G |
| 70 | H |
| 80 | I |
| 90 | J |
| 100 | K |

US 9,231,366 B2

OPTICAL TRANSMITTING DEVICE AND OPTICAL TRANSMISSION SYSTEM

CROSS-REFERENCE TO RELATED APPLICATION

This application is based upon and claims the benefit of priority of the prior Japanese Patent Application No. 2013-055693, filed on Mar. 18, 2013, the entire contents of which are incorporated herein by reference.

FIELD

The embodiments discussed herein are related to an optical transmitting device and an optical transmission system.

BACKGROUND

High-speed Internet access services, such as fiber to the home (FTTH) service, have been in widespread use recently. The FTTH services include passive optical network (PON) in which a single optical fiber is shared by multiple users.

Japanese Laid-open Patent Publication No. 9-18412 discloses a technique that determines a degraded state of a laser diode by comparing a degradation determination voltage with a voltage corresponding to a pre-bias current value occurring immediately before the laser diode (LD) shifts to a laser oscillation state thereof. Japanese Laid-open Patent Publication No. 2005-197984 discloses a technique that determines an LD degradation based on driving current data following temperature characteristics that keep an optical signal output at a specific level, and corrects driving current control data in order to control an optical signal output in an initial operation state to a specific level.

SUMMARY

According to an aspect of the invention, an optical transmitting device includes: a laser diode to which one of a first driving current and a second driving current is provided; a controller configured to provide the laser diode with the first driving current to transmit an optical signal and with a plurality of second driving currents, to emit light, different from each other in magnitude during a stop of providing the first driving current; a measuring unit configured to measure an intensity of the light emitted by the laser diode; a calculator configured to calculate a threshold current of the laser diode, based on the intensities corresponding to the plurality of second driving currents measured by the measuring unit and magnitudes of the plurality of second driving currents; and a determination unit configured to determine a precursor of a sudden-death of the laser diode, based on an amount of variation in the threshold current calculated by the calculator during a specific period.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2A illustrates a configuration example of the optical transmitting device of a second embodiment;

FIG. 2B illustrates an example of a signal flow in the configuration of the optical transmitting device of FIG. 2A;

FIG. 3A illustrates an example of a communication system including the optical transmitting device;

FIG. 4A illustrates an example of a receiving timing of an uplink optical signal in an optical line terminal (OLT);

FIG. 4B illustrates a first example of timing at which a laser diode (LD) chip emits faint light;

FIG. 5 illustrates a plot of an example of a relationship between a driving current in the LD and an output power thereof;

FIG. 9B illustrates an example of a signal flow in the configuration of the driver and the LD chip of FIG. 9A;

FIG. 10A illustrates an example of a configuration of an electrical switch circuit;

FIG. 10B illustrates an example of an operation of a switching circuit of the electrical switch circuit;

FIG. 13A illustrates an example of a configuration of the optical transmitting device of a third embodiment;

DESCRIPTION OF EMBODIMENTS

Optical transmitting devices and optical transmission systems of embodiments are described in detail with reference to the drawings. The optical transmitting devices and the optical transmission systems may herein early predict a failed state in which light output from a laser diode is suddenly stopped and the laser diode becomes to be inoperative, the failed state may be called a sudden-death.

First Embodiment

Configuration of Optical Transmitting Device of First Embodiment

Figure 1A:
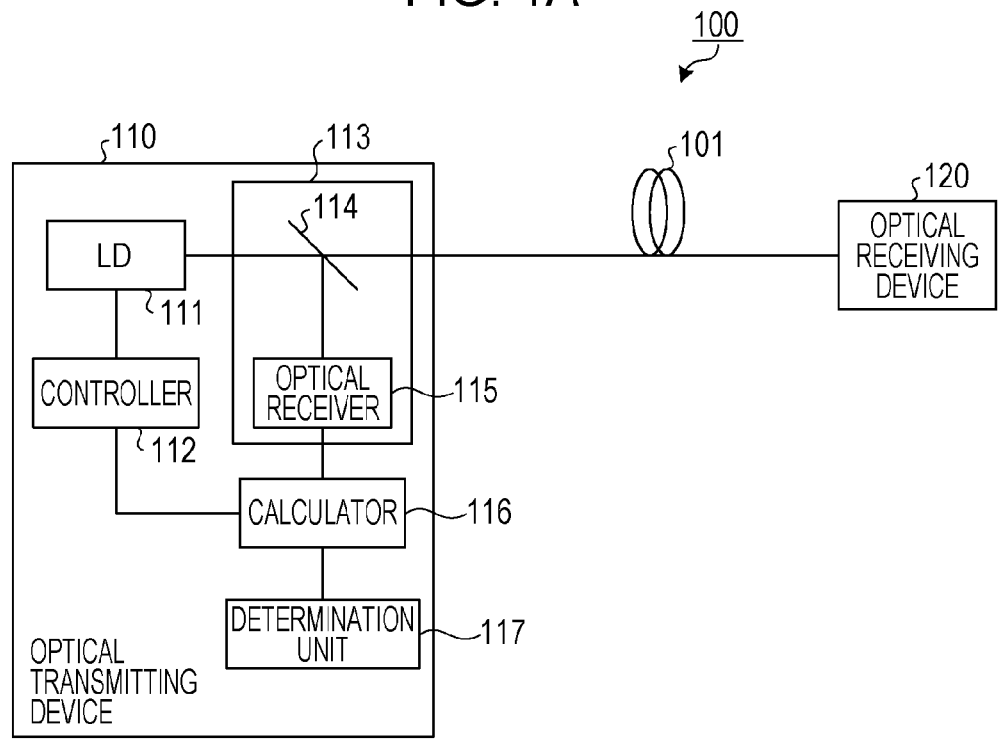
FIG. 1A illustrates a configuration example of the optical transmitting device of a first embodiment.
Figure 1B:
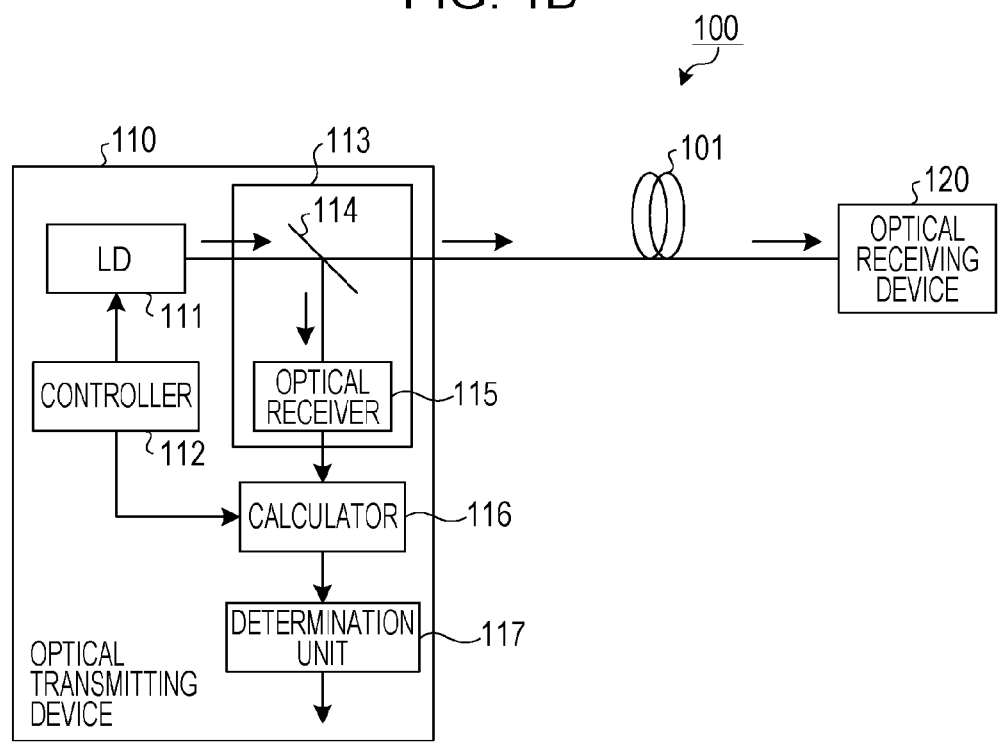
FIG. 1B illustrates an example of a signal flow in the configuration of the optical transmitting device of FIG. 1A.

FIG. 1A illustrates a configuration example of the optical transmitting device of a first embodiment. FIG. 1B illustrates an example of a signal flow in the configuration of the optical transmitting device of FIG. 1A. As illustrated in FIG. 1A and FIG. 1B, the optical transmission system 100 of the first embodiment includes the optical transmitting device 110 and an optical receiving device 120.

The optical transmitting device 110 transmits an optical signal to the optical receiving device 120 via an optical transmission channel 101. The optical receiving device 120 receives the optical signal from the optical transmitting device 110 via the optical transmission channel 101. The optical transmitting device 110 in the optical transmission system 100 may share the optical transmission channel 101 with another optical transmitting device, and may transmit the optical signal to the optical receiving device 120 via the shared optical transmission channel 101.

The optical transmitting device 110 includes a laser diode (LD) 111, a controller 112, a measuring unit 113, a calculator 116, and a determination unit 117. The LD 111 is a laser diode that emits an optical signal in response to an input driving current.

The controller 112 inputs a first driving current to the LD 111, and the LD 111 emits an optical signal in response to the first driving current. The controller 112 also causes the LD 111 to emit faint light by multiple times during a periodic duration within a period throughout the optical transmitting device 110 transmits no optical signal to the optical receiving device 120 as a transmission destination. For example, the controller 112 inputs a second driving current to the LD 111 by multiple times. The second driving current is lower than the first driving current, for example.

The controller 112 sets multiple second driving currents to be different from each in magnitude. The multiple second driving currents may be a driving current that is input intermittently by multiple times or may be a driving current that changes in magnitude in a stepwise fashion. The controller 112 notifies the calculator 116 of the magnitude of the input second driving current and the input timing of the second driving current.

For example, the optical transmitting device 110 transmits the optical signal during a period notified by the optical receiving device 120 as the transmission destination of the optical signal. To this end, the controller 112 inputs the first driving current to the LD 111. The controller 112 causes the LD 111 to emit faint light during a period different from the period notified by the optical receiving device 120. The period throughout which the LD 111 emits the faint light is not limited to the period notified by the optical receiving device 120, and may be a variety of periods throughout which the optical transmitting device 110 transmits no optical signal, including a period throughout which there is no optical signal the optical transmitting device 110 has to transmit, for example.

The measuring unit 113 measures the intensity of the light emitted from the LD 111. More specifically, the measuring unit 113 includes a splitting unit 114 and an optical receiver 115. The splitting unit 114 sends part of the light (forward output light) emitted from the LD 111 to the optical transmission channel 101 while outputting another part split from the light emitted according to intensity from the LD 111 to the optical receiver 115. The optical receiver 115 receives the light output from the splitting unit 114 and then outputs a signal responsive to the intensity of the received light to the calculator 116.

At a timing notified by the controller 112, the calculator 116 acquires the intensity measured by the measuring unit 113 when the controller 112 inputs the second driving current by multiple times. The calculator 116 calculates the threshold value of the LD 111 in accordance with the acquired intensity and the magnitude of the second driving current notified by the controller 112. The threshold current is a threshold value which triggers the LD 111 to start laser oscillation. For example, the calculator 116 calculates a correlation between the driving current and the output intensity of the LD 111, and calculates the threshold current of the LD 111 in accordance with the calculated correlation. The calculator 116 notifies the determination unit 117 of the calculated threshold current.

The determination unit 117 determines the presence or absence of a precursor of a sudden-death of the LD 111 in response to an amount of variation during a specific period in the threshold current notified by the calculator 116. More specifically, the determination unit 117 determines the presence or absence of the precursor of a sudden-death of the LD 111 by comparing a specific value with the amount of variation during the specific period in the threshold current notified by the calculator 116.

For example, the determination unit 117 determines the presence or absence of the precursor of a sudden-death of the LD 111 by comparing a specific value with a difference between the threshold current presently notified by the calculator 116 and the threshold current previously notified by the calculator 116. Also, the determination unit 117 may determine the presence or absence of the precursor of a sudden-death of the LD 111 by comparing a specific value with a difference between the threshold current presently notified by the calculator 116 and the mean value of multiple threshold currents heretofore notified by the calculator 116.

Alternatively, the determination unit 117 may calculate a difference between the threshold current presently notified by the calculator 116 and the threshold current notified for the first time by the calculator 116, and may determine the presence or absence of the precursor of a sudden-death of the LD 111 by comparing a specific value with a difference between the presently calculated difference and the previously calculated difference. Alternatively, the determination unit 117 may determine the presence or absence of the precursor of a sudden-death of the LD 111 by comparing a specific value with a difference between an increase in the threshold current presently notified over the threshold current previously notified and an increase in the threshold current previously notified over the multiple threshold values notified until before the previous time. The determination unit 117 outputs determination results.

The optical transmitting device 110 causes the LD 111 to emit faint light with the magnitude of the driving current varied during a periodic duration within a period throughout which the optical transmitting device 110 transmits no optical signal and measures the threshold current of the LD 111. The optical transmitting device 110 may thus detect a sharp change in the threshold current. The optical transmitting device 110 thus determines the presence or absence of the precursor of a sudden-death of the LD 111 without stopping the operation of an optical communication.

The optical transmitting device 110 may include multiple LDs 111. The multiple LDs 111 may be formed as separate chips or may be formed as a single chip by arranging multiple electrodes and multiple active layers on the single chip. The controller 112 inputs the first driving current and the second driving current to one of the multiple LDs 111. If the determination unit 117 outputs a determination result that a precursor of a sudden-death is detected on a current LD, the controller 112 switches from the presently used LD to another LD, from among the multiple LDs 111, to receive the first driving current.

If there is a precursor of a sudden-death in the LD 111 in use among the multiple LDs 111, the controller 112 switches from the presently used LD to another LD, and avoids interruption of the transmission of the optical signal (system down).

The optical transmitting device 110 causes the LD 111 to emit faint light by reducing the second driving current to be lower than the first driving current. If the periodic duration throughout which the LD 111 is caused to emit faint light without transmitting the optical signal overlaps at least part of a period during which another optical transmitting device transmits an optical signal, the effect caused by the optical transmitting device 110 on the optical signal transmitted by the other optical transmitting device sharing the optical transmission channel 101 is controlled. However, if the periodic duration throughout which the LD 111 is caused to emit faint light without transmitting the optical signal does not overlap the period during which the other optical transmitting device transmits the optical signal, the second driving current is not limited to any particular magnitude.

Sudden-Death of LD

The sudden-death is described below. The LD suffers a crystal fault because of a variety of factors such as LD materials. The crystal fault grows with time, and when the crystal fault intrudes into an active layer, a no-emission area is created in part of the active layer. As the no-emission area grows, the optical output power responsive to the driving current decreases. To maintain high optical output power, a high driving current is drawn into the LD, and the growth of the no-emission area advances rapidly. If the no-emission area is formed over a wide region in the active layer or on an end face of the active layer or in the vicinity of the end face, light absorption increases at an accelerated pace. Then, suddenly, laser oscillation is no longer possible, and the LD stops emitting light.

Since the LD sudden-death is progressive as a fault mode, it is difficult to remove the cause for the mode in a shipment test and a screening test prior to operation. A drop in the optical output power and an increase in the current may be monitored during operation. The time from beginning to detect a drop in the optical output power or an increase in the current, whichever is at a narrowly detectable level, to a sudden-death is typically short, and it is difficult to early predict the precursor of the sudden-death of the LD.

If a no-emission area is created in the active layer of the LD, the energy band gap in the area of the no-emission area becomes smaller. The confinement of electrodes becomes insufficient, and an inverted distribution is difficult to form. A light absorption phenomenon takes place in the no-emission area, and a carrier density of the entire active layer increases to compensate for this. For this reason, the level of the driving current consumed before the start of stimulated emission of laser (threshold current) increases. In view of this current increase, the optical transmitting device 110 monitors the threshold current of the LD, captures an initial symptom in the process of the sudden-death, and thus early detects the precursor of the sudden-death.

The threshold current of the LD gradually increases because of wear and degradation even if the LD does not fail. The optical transmitting device 110 monitors a sharp change in the threshold current of the LD and thus discriminates between the precursor of the sudden-death and the wear and degradation normally observed in the LD. The optical transmitting device 110 thus early detects the precursor of the sudden-death.

For a general understanding of the sudden-death, reference is made to non-patent literature (NEC Electronics Corporation, "Technical Note PQ10478JJ02V0TN (second version)" pages 92-94, 2006, [online], [searched Jan. 22, 2013], Internet <URL: http://japan.senesas.com/products/common_info/reliability/jp/download/PQ10478JJ02V0TN_ch03.pdf>, section 3.2.11), for example.

Second Embodiment

Configuration of Optical Transmitting Device of Second Embodiment

FIG. 2A illustrates a configuration example of the optical transmitting device of a second embodiment. FIG. 2B illustrates an example of a signal flow in the configuration of the optical transmitting device of FIG. 2A. As illustrated in FIG. 2A and FIG. 2B, an optical transmitting device 200 of the second embodiment includes a signal data generator 211, a driver 212, an LD chip 213, a lens 214, and an optical fiber 220.

The optical transmitting device 200 further includes a photo diode (PD) chip 231, an optical current monitor 232, a characteristics degradation detection controller 241, a threshold current calculator 242, a threshold current storage unit 243, a variation calculator 251, and a characteristics determination unit 252.

The signal data generator 211 generates signal data to be transmitted by the optical transmitting device 200. The signal data generator 211 acquires transmission period information indicating a transmission period during which the optical transmitting device 200 is to transmit an optical signal. The signal data generator 211 outputs the generated signal data to the driver 212 during the transmission period indicated by the acquired transmission period information.

The transmission period information may be acquired from a communication device as a transmission destination of the optical signal or from an upper system. Alternatively, the transmission period information may be stored on a memory of the optical transmitting device 200. The signal data generator 211 outputs to the characteristics degradation detection controller 241 no-transmission period information indicating a no-transmission period throughout which the optical transmitting device 200 transmits no optical signal and which is different from the transmission period indicated by the transmission period information.

The driver 212 controls the LD chip 213. For example, the driver 212 outputs to the LD chip 213 the driving current responsive to the signal data output from the signal data generator 211, thereby causing the optical signal to be transmitted. The driver 212 also outputs to the LD chip 213 the driving current responsive to emission instruction information output from the characteristics degradation detection controller 241, thereby causing the LD chip 213 to emit faint light.

The driver 212 switches from one active layer to another active layer to emit light from among multiple active layers of the LD chip 213 when the characteristics degradation detection controller 241 outputs switching instruction information. The switching of the active layer among the multiple active layers is described below (see FIG. 8A through FIG. 10B, for example).

The LD chip 213 emits light in response to the driving current output from the driver 212. In this way, the optical signal responsive to the signal data output from the signal data generator 211 to the driver 212 is output from the LD chip 213. The PD chip 231 emits faint light in response to the emission instruction information output from the characteristics degradation detection controller 241 to the driver 212.

The lens 214 transmits the light (optical signal) emitted from the LD chip 213 toward the optical fiber 220. For example, the lens 214 collimates light emitted from the LD chip 213 in a diffused state to a beam diameter smaller than 10 μm, for example, and then outputs the collimated light to the optical fiber 220. The light includes the optical signal.

The optical fiber 220 is a transmission channel to transmit light. The optical fiber 220 includes a core 221 and a clad 222. The light output from the lens 214 is coupled with the core 221, and is then transmitted through the core 221.

An end face 223 of the lens 214 in the optical fiber 220 is polished to be formed at a slant angle with respect to the light output from the lens 214, for example. This is a typical technique used in a single-fiber bi-directional transceiver to restrain reflection of output light in the direction of the end face 223 of the core 221. In this way, light reflected from the end face 223 out of the light output from the lens 214 and coupled with the optical fiber 220 is output in a direction different from the direction of the light output from the lens 214. In one desirable embodiment, the optical fiber 220 is simplified taking advantage of this structure. There is more on this below.

For example, as illustrated in FIG. 2B, the end face 223 may now be formed at an angle of (90-θ) degrees with respect to the direction of the light output from the lens 214. If light refraction at the end face 223 is neglected, a reflection angle of the light output from the lens 214 is θ according to Snell's law.

The optical transmitting device 200 includes the optical fiber 220. In the optical fiber 220, the end face 223 is formed at a slant angle with respect to the direction of the light output from the LD chip 213 so that the light incident on the end face 223 out of the light output from the LD chip 213 is transmitted.

The photo diode (PD) chip 231 receives the light output from the lens 214 and then reflected from the end face 223 of the optical fiber 220. The PD chip 231 outputs a current signal responsive to the received optical power to the optical current monitor 232.

The optical current monitor 232 may have a larger diameter in view of position displacement, an error in temperature and other factors. For example, if the beam diameter of the light output from the lens 214 and then reflected from the end face 223 of the optical fiber 220 is smaller than 10 μm, a photo diode having a light receiving diameter of 100 μm may be used for the PD chip 231. It is sufficient enough if the optical current monitor 232 monitors DC power, and thus the optical current monitor 232 having a low frequency-response performance may be acceptable.

In the optical transmitting device 200, the PD chip 231 receives the light emitted from the LD chip 213 and then reflected from the end face 223 of the optical fiber 220. An intensity of the light is thus measured in accordance with light reception results of the PD chip 231. A measuring unit that measures the intensity of the light from the LD chip 213 may feature a simple and space-saving design in this way.

The optical current monitor 232 monitors the magnitude of the driving current output from the PD chip 231 as a received optical current. For example, the optical current monitor 232 includes a transimpedance amplifier (TIA) that converts a current signal output from the PD chip 231 into a voltage signal and an analog-to-digital converter (ADC) that converts the converted voltage signal into a digital signal. The optical current monitor 232 outputs to the threshold current calculator 242 received optical current information indicating a monitored received optical current.

During a no-transmission period indicated by the no-transmission period information output from the signal data generator 211, the characteristics degradation detection controller 241 outputs to the driver 212 emission instruction information to instruct the LD chip 213 to emit light. The emission instruction signal indicates the timing of outputting the driving current to the LD chip 213 and the magnitude of the driving current output to the LD chip 213. The characteristics degradation detection controller 241 also outputs to the threshold current calculator 242 driving current information indicating the timing and the magnitude of the driving current indicated by the emission instruction information.

When the characteristics determination unit 252 outputs detection information, the characteristics degradation detection controller 241 outputs to the driver 212 switching instruction information to instruct the active layers to be switched to emit light from among the multiple active layers of the LD chip 213.

The threshold current calculator 242 acquires the received optical current information output from the optical current monitor 232 and the driving current information output from the characteristics degradation detection controller 241. In response to the acquired information, the threshold current calculator 242 acquires a combination of the driving current output to the LD chip 213 and the received optical current of the PD chip 231, related to multiple times of faint light emissions of the LD chip 213 during the no-transmission period.

The threshold current calculator 242 calculates the threshold current of the LD chip 213 in accordance with the combination of the driving current and the received optical current acquired for the multiple times of faint light emissions. The threshold current calculator 242 then causes the threshold current storage unit 243 to store the calculated threshold current. The threshold current calculator 242 periodically calculates the threshold current of the LD chip 213 and causes the threshold current storage unit 243 to store calculated threshold currents. For example, the threshold current storage unit 243 stores two latest threshold currents.

In accordance with the threshold current stored on the threshold current storage unit 243, the variation calculator 251 calculates an amount of variation in the threshold current of the LD chip 213 within a specific period. For example, the variation calculator 251 calculates the amount of variation in the threshold current of the LD chip 213 by calculating a difference between the two latest threshold values stored on the threshold current storage unit 243. The variation calculator 251 notifies the characteristics determination unit 252 of the calculated amount of variation.

The characteristics determination unit 252 determines the presence or absence of a precursor of a sudden-death of the LD chip 213 by detecting a sharp change in the threshold current of the LD chip 213 in response to the amount of variation notified by the variation calculator 251. For example, upon determining that the amount of variation notified by the variation calculator 251 exceeds a specific value, the characteristics determination unit 252 determines that the precursor of the sudden-death of the LD chip 213 is present. If the amount of variation notified by the variation calculator 251 is not above the specific value, the characteristics determination unit 252 determines that the precursor of the sudden-death of the LD chip 213 is not present.

Upon determining that the precursor of the sudden-death of the LD chip 213 is present, the characteristics determination unit 252 outputs an alarm notifying a maintenance person of the optical transmitting device 200 of the detection of the precursor of the sudden-death of the LD chip 213. Upon determining that the precursor of the sudden-death of the LD chip 213 is present, the characteristics determination unit 252 outputs to the characteristics degradation detection controller 241 detection information indicating the detection of the precursor of the sudden-death of the LD chip 213.

The LD 111 of FIG. 1A and FIG. 1B may be implemented by the LD chip 213, for example. The controller 112 of FIG. 1A and FIG. 1B may be implemented by the driver 212 and the characteristics degradation detection controller 241, for example. The splitting unit 114 of FIG. 1A and FIG. 1B may be implemented by the end face 223 in the optical fiber 220, for example. The optical receiver 115 of FIG. 1A and FIG. 1B may be implemented by the PD chip 231, for example. The calculator 116 FIG. 1A and FIG. 1B may be implemented by the threshold current calculator 242, for example. The determination unit 117 of FIG. 1A and FIG. 1B may be implemented by the threshold current storage unit 243, the variation calculator 251 and the characteristics determination unit 252, for example.

The threshold current storage unit 243 may be implemented by an electrically erasable programmable read only memory (EEPROM), or a non-volatile memory such as a flash memory.

The signal data generator 211, the driver 212, the characteristics degradation detection controller 241, the threshold current calculator 242, the variation calculator 251 and the characteristics determination unit 252 may be implemented by a microcomputer, a central processing unit (CPU), or an arithmetic circuit based on firmware.

Communication System Incorporating Optical Transmitting Device

FIG. 3A illustrates an example of a communication system including the optical transmitting device. The communication system 300 of FIG. 3A is a PON system including an optical line terminal (OLT) and multiple optical network units (ONUs) connected to the OLT via a coupler. As illustrated in FIG. 3A, the communication system 300 includes the OLT 310, ONUs 321 through 324 (A-D), a transmission channel 302, and a splitter 303.

The OLT 310 includes an LD 311, optical filters 312 and 313, and a PD 314. The LD 311 generates a downlink optical signal of a wavelength $\lambda 1$ and emits the downlink optical signal to the optical filter 312. The optical filter 312 outputs from the OLT 310 the downlink optical signal of the wavelength $\lambda 1$ emitted from the LD 311. Also, the optical filter 312 outputs the optical signal other than the optical signal having the wavelength $\lambda 1$ input to the OLT 310 to the optical filter 313.

The optical filter 313 extracts an uplink optical signal having a wavelength $\lambda 2$ from the optical signal output from the optical filter 312 and then outputs the extracted uplink optical signal to the PD 314. The PD 314 receives the uplink optical signal having the wavelength $\lambda 2$ from the optical signal output from the optical filter 313 and then outputs the received uplink optical signal.

The transmission channel 302 transmits the downlink optical signal having the wavelength $\lambda 1$ output from the OLT 310 and then outputs the downlink optical signal to the splitter 303. The transmission channel 302 transmits optical signal output from the splitter 303 and then outputs the optical signal to the OLT 310.

The splitter 303 N-splits the optical signal output from the transmission channel 302 (N=2, 3, 4, . . . ), and then outputs the split optical signals to N channels. The splitter 303 wavelength multiplexes optical signal output from the N channels, and then outputs the multiplexed optical signal to the transmission channel 302. For example, each of the optical signals from the N channels includes an uplink optical signal having the wavelength $\lambda 2$ from the multiple ONUs including the ONU 321 through 324.

The configuration of the ONU 322 is described below. The description of the configuration of the ONU 322 is also applicable to the ONUs 321, 323, and 324. The ONU 322 includes an LD 331, optical filters 332 and 333, and a PD 334. The LD 331 generates an uplink optical signal having a wavelength $\lambda 2$ and emits the uplink optical signal to the optical filter 332. The optical filter 332 outputs from the ONU 322 the uplink optical signal of the wavelength $\lambda 2$ emitted from the LD 331. Also, the optical filter 332 outputs the optical signal other than the optical signal having the wavelength $\lambda 2$ input to the ONU 322 to the optical filter 333.

The optical filter 333 extracts a downlink optical signal having a wavelength $\lambda 1$ from the optical signal output from the optical filter 332 and then outputs the extracted downlink optical signal to the PD 334. The PD 334 receives the downlink optical signal having the wavelength $\lambda 1$ from the optical signal output from the optical filter 333 and then outputs the received downlink optical signal.

Each of the ONUs 321 through 324 transmits the uplink optical signal from the optical transmitting device during the transmission period notified by the OLT 310, for example. In this way, the uplink optical signals from the ONUs 321 through 324 are transmitted at different timings. The uplink optical signals from the ONUs 321 through 324 are transmitted in optical time division multiplexing (OTDM).

The optical transmitting device 200 of FIG. 2A and FIG. 2B may be applicable to the LD 311 and the LD 331 of at least one of the ONUs 321 through 324, for example. In the following discussion, the optical transmitting device 200 is applied to the LD 331 of the ONU 322 or is applied to the LD 331 of each of the ONUs 321 through 324. In such a case, the optical transmitting device 200 of FIG. 2A and FIG. 2B may acquire the transmission period information by receiving the transmission period information from the OLT 310.

In the PON system such as the communication system 300, time slots are assigned to the ONUs 321 through 324 in time division multiplexing, and the ONUs 321 through 324 transmit optical signals at specific timings. If the optical transmitting device 200 is applied to the ONUs 321 through 324, each ONU may autonomously diagnose the precursor of a failure during the no-transmission period throughout which the optical transmitting device transmits no optical signal.

Even while the optical transmitting device transmits no optical signal, another ONU may transmit an optical signal. A small current may be delivered to the LD chip 213 to cause the LD chip 213 to emit faint light that does not affect the optical signal from the other ONU.

Wavelength Band Used in Communication System

Figure 3B:
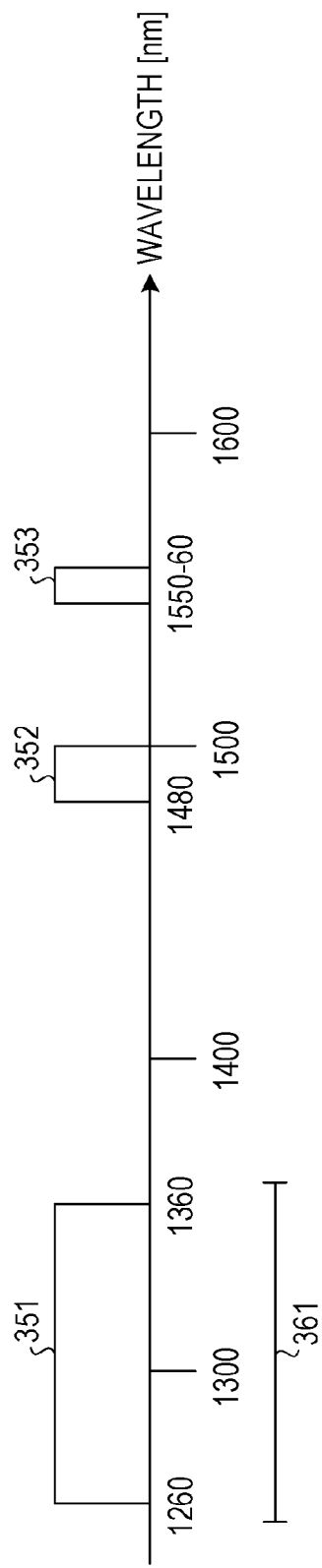
FIG. 3B illustrates an example of a wavelength band for use in the communication system.

FIG. 3B illustrates an example of a wavelength band for use in the communication system. In FIG. 3B, the horizontal axis represents wavelength. If the communication system 300 of FIG. 3A is 1 Gbps gigabit Ethernet-PON, wavelength bands 351 through 353 are used in the communication system 300. Note that Ethernet is a registered trademark.

The wavelength band 351 is used in upstream from the ONUs 321 through 324 to the OLT 310, and corresponds to the wavelength $\lambda 2$. The wavelength band 352 is used in downstreams from the OLT 310 to the ONUs 321 through 324 and corresponds to the wavelength $\lambda 1$. The wavelength band 353 is used in video signals from the OLT 310 to the ONUs 321 through 324, and corresponds to the wavelength $\lambda 1$.

Receiving Timing of Optical Signal in OLT

FIG. 4A illustrates an example of a receiving timing of an uplink optical signal in the OLT. In FIG. 4A, the horizontal axis represents time in seconds, and the vertical axis represents the received optical power of the OLT 310 in dBm. Burst periods T1, T2, . . . , Tn in the horizontal axis respectively represent series of periods, during which the ONUs 321 through 324 transmit optical signals.

The burst period T1 includes transmission periods T1$d$, T1$c$, T1$b$, and T1$a$. The transmission periods T1$d$, T1$c$, T1$b$, and T1$a$ represent periods during which the ONUs 324 through 321 respectively transmit optical signals in the burst period T1. Optical signals D1$d$, D1$c$, D1$b$, and D1$a$ are optical signals that the ONUs 324 through 321 respectively transmits during the transmission periods T1$d$, T1$c$, T1$b$, and T1$a$.

Similarly, the burst period Tn (n=1, 2, 3, . . . ) includes transmission periods Tnd, Tnc, Tnb, and Tna. The transmission periods Tnd, Tnc, Tnb, and Tna represent periods during which the ONUs 324 through 321 respectively transmit optical signals in the burst period Tn. Optical signals Dnd, Dnc, Dnb, and Dna are optical signals that the ONUs 324 through 321 respectively transmits during the transmission periods Tnd, Tnc, Tnb, and Tna.

Timing of LD Chip to Emit Faint Light

FIG. 4B illustrates a first example of timing at which an LD chip emits faint light. In FIG. 4B, elements identical to those in FIG. 4A are designated with the same reference symbols, and the discussion thereof is omitted. In FIG. 4B, the horizontal axis represents time in seconds, and the vertical axis represents the received light power of the ONU 323(C) in dBm. As illustrated in FIG. 4A, the ONU 323 transmits optical signals D1$c$, D2$c$, . . . , Dnc during transmission periods T1$c$, T2$c$, . . . , Tnc, respectively.

The ONU 323 causes the LD chip 213 to emit faint light during first half of each of the burst periods T1, T2, . . . , Tn. Faint light S1, S2, and S3 is caused when the LD chip 213 emits faint light. Faint light S1 is lower in power than faint light S2, and faint light S3 is higher in power than faint light S2. In this way, the ONU 323 causes the LD chip 213 to emit faint light by multiple times at different power during the period different from the burst periods T1$c$, T2$c$, . . . , Tnc during which the ONU 323 transmits the optical signals.

The ONU 323 calculates the threshold current of the LD chip 213 by monitoring the power of the faint light S1, S2, and S3. The faint light S1, S2, and S3 has power lower than the optical signals D1$c$, D2$c$, . . . , Dnc by about 20 dB. In this way, the optical transmitting device controls the effect of the emission on communications while calculating the threshold current of the LD chip 213 in the ONU 323.

Figure 4C:
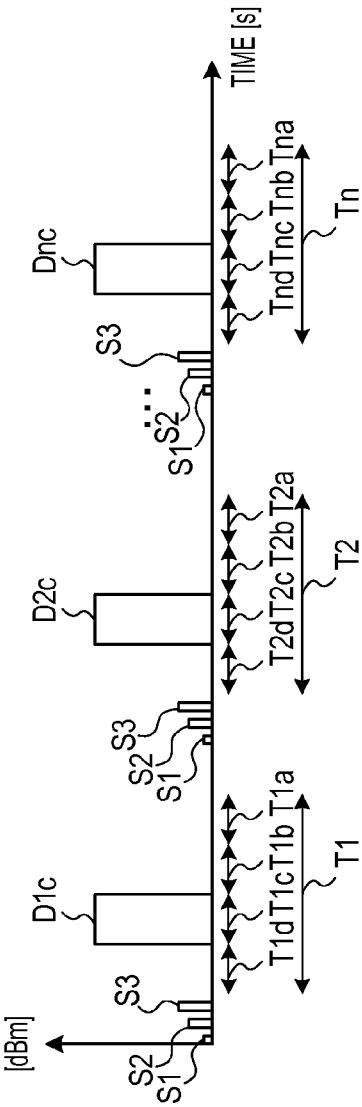
FIG. 4C illustrates a second example of timing at which the LD chip emits faint light.

FIG. 4C illustrates a second example of timing at which the LD chip emits faint light. In FIG. 4C, elements identical to those in FIG. 4B are designated with the same reference symbols, and the discussion thereof is omitted herein. As illustrated in FIG. 4C, the ONU 323 may cause the LD chip 213 to emit faint light during the second half of each of the burst periods T1, T2, . . . , Tn.

Figure 4D:
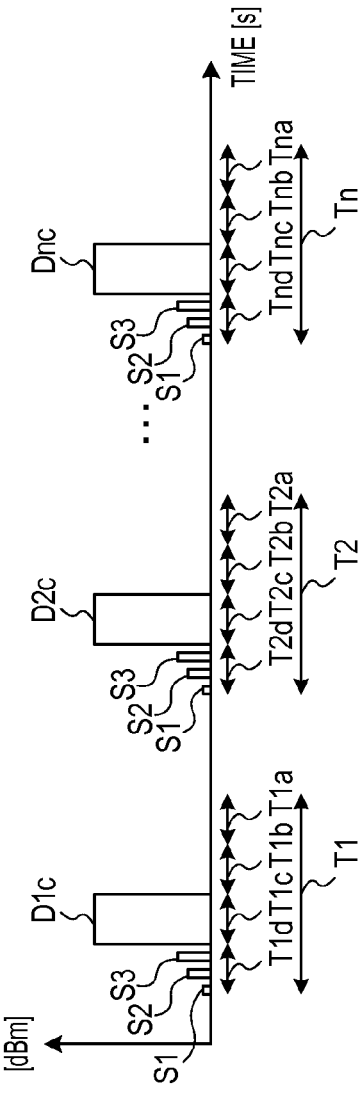
FIG. 4D illustrates a third example of timing at which the LD chip emits faint light.

FIG. 4D illustrates a third example of timing at which the LD chip emits faint light. In FIG. 4D, elements identical to those in FIG. 4C are designated with the same reference symbols, and the discussion thereof is omitted herein. As illustrated in FIG. 4D, the ONU 323 may cause the LD chip 213 to emit faint light during the transmission period during which another ONU transmits the optical signal.

As illustrated in FIG. 4D, the ONU 323 causes the LD chip 213 to emit faint light during each of the periods T1$d$, T2$d$, . . . , Tnd throughout which the ONU 324 (D) transmits the optical signal. In this case as well, the power of the faint light S1, S2, and S3 are weak enough. The optical transmitting device controls the effect of the ONU 323 on communications while calculating the threshold current of the LD chip 213 in the ONU 323.

Figure 4E:
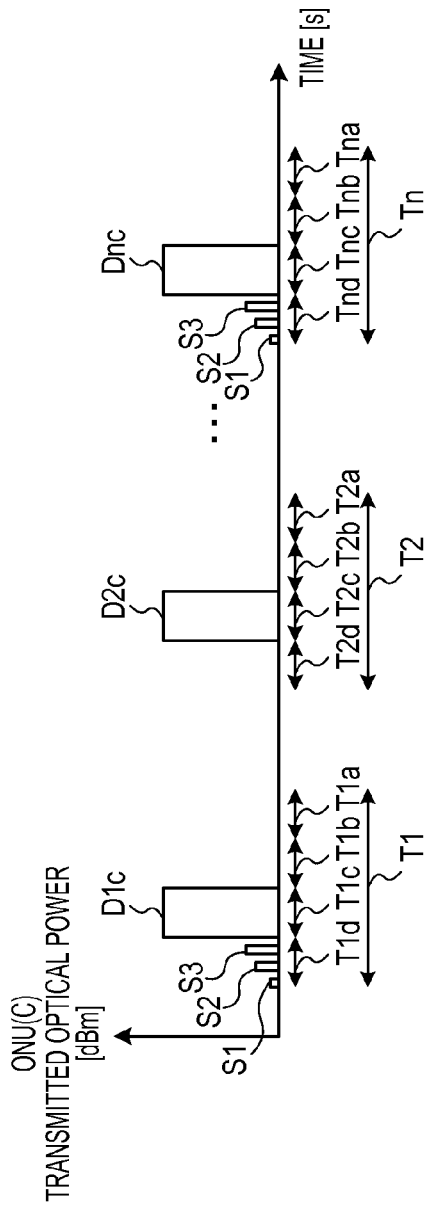
FIG. 4E illustrates a fourth example of timing at which the LD chip emits faint light.

FIG. 4E illustrates a fourth example of timing at which the LD chip emits faint light. In FIG. 4E, elements identical to those in FIG. 4D are designated with the same reference symbols, and the discussion thereof is omitted herein. Referring to FIG. 4B through FIG. 4D, the ONU 323 causes the LD chip 213 to emit faint light in response to each of the burst periods T1, T2, . . . , Tn.

In contrast, the ONU 323 causes the LD chip 213 to emit faint light in response to some of the burst periods T1, T2, . . . , Tn as illustrated in FIG. 4E. In the example of FIG. 4E, the ONU 323 causes the LD chip 213 to emit faint light during the burst period T1 while not causing the LD chip 213 to emit faint light during the burst period T2.

Figure 4F:
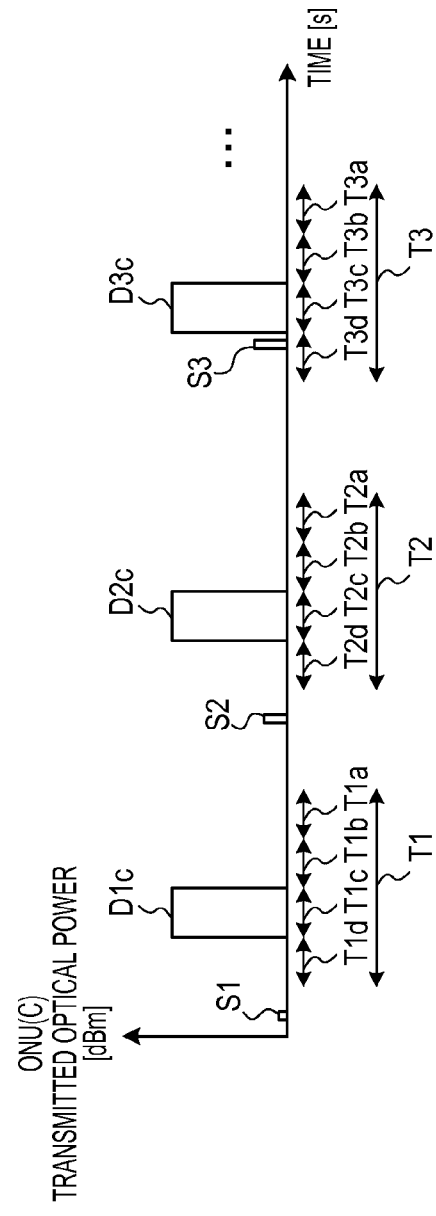
FIG. 4F illustrates a fifth example of timing at which the LD chip emits faint light.

FIG. 4F illustrates a fifth example of timing at which the LD chip emits faint light. In FIG. 4F, elements identical to those in FIG. 4E are designated with the same reference symbols, and the discussion thereof is omitted herein. Referring to FIG. 4B through FIG. 4D, the ONU 323 causes the LD chip 213 to emit faint light by multiple times (for example, three times) in response to each of the burst periods T1, T2, . . . , Tn.

In contrast, the ONU 323 causes the LD chip 213 to emit faint light one time in response to each of the burst periods T1, T2, . . . , Tn as illustrated in FIG. 4F. In the example of FIG. 4F, the ONU 323 causes the LD chip 213 to emit faint light S1, S2 and S3 in response to the burst periods T1, T2 and T3, respectively.

Figure 4G:
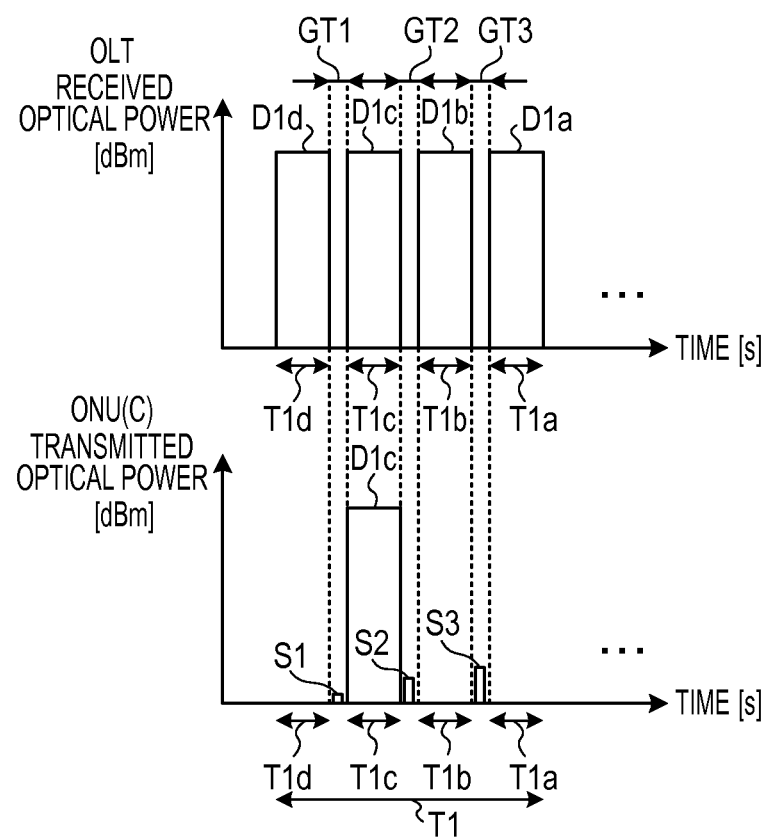
FIG. 4G illustrates a sixth example of timing at which the LD chip emits faint light.

FIG. 4G illustrates a sixth example of timing at which the LD chip emits faint light. As illustrated in FIG. 4G, elements identical to those in FIG. 4A are designated with the same reference symbols, and the discussion thereof is omitted herein. The burst period T1 is described with reference to FIG. 4G, and the same discussion is applicable to the burst periods T2, . . . , Tn. Guard times GT1, GT2 and GT3 of FIG. 4G are respectively arranged between the transmission periods T1$d$ and T1$c$, between the transmission periods T1$c$ and T1$b$, and between the transmission periods the transmission periods T1$b$ and T1$a$. The guard times are durations throughout which none of the ONUs 321 through 324 transmit the optical signals.

Referring to FIG. 4G, the ONU 323 may cause the LD chip 213 to emit faint light during each of the guard times GT1, GT2 and GT3. In the example of FIG. 4G, the ONU 323 outputs the faint light S1, S2 and S3 respectively during the guard times GT1, GT2 and GT3.

Figure 4H:
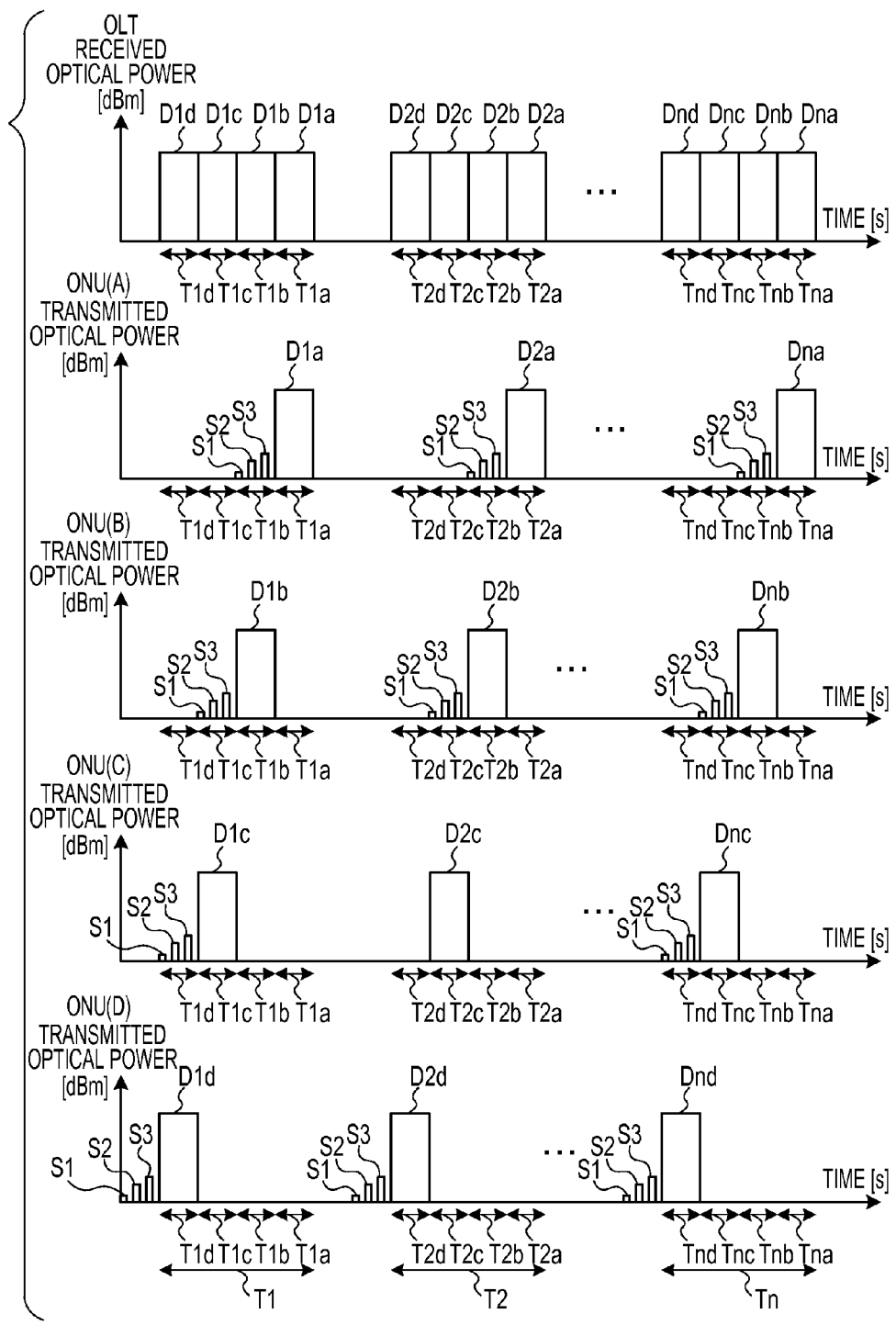
FIG. 4H illustrates a seventh example of timing at which the LD chip emits faint light.

FIG. 4H illustrates a seventh example of timing at which the LD chip emits faint light. As illustrated in FIG. 4H, elements identical to those illustrated in FIG. 4A are designated with the same reference symbols and the discussion thereof is omitted herein. If the optical transmitting device 200 is incorporated in each of the ONUs 321 through 324, each of the ONUs 321 through 324 causes the LD chip 213 to emit faint light during the transmission period while another ONU transmits the optical signal or during a period while none of the ONUs 321 through 324 transmit the optical signals.

In the example of FIG. 4H, the ONU 321(A) causes the LD chip 213 to emit faint light during each of periods T1$b$, T2$b$, . . . , Tn$b$ during which the ONU 322(B) transmits the optical signal. The ONU 322(B) causes the LD chip 213 to emit faint light during each of periods T1$c$, T2$c$, . . . , Tn$c$ during which the ONU 323(C) transmits the optical signal. The ONU 323(C) causes the LD chip 213 to emit faint light during each of periods T1$d$, T2$d$, . . . , Tn$d$ during which the ONU 324(D) transmits the optical signal. The ONU 324(D) causes the LD chip 213 to emit faint light during second half of each of the burst periods T1, T2 . . . , Tn.

Referring to FIG. 4B through FIG. 4H, one of the ONUs 321 through 324 that incorporates the optical transmitting device 200 causes the PD chip 231 to emit faint light during the period while the optical transmitting device 200 does not transmits the optical signal. In this way, the effect of the ONU and the other ONUs on communications is controlled while a sudden-death of the LD chip 213 is predicted.

As described above, the faint light S1, S2 and S3 are continually output by inputting driving currents different in magnitude continually. Alternatively, the driving currents different in magnitude may be consecutively input to consecutively output the faint light S1, S2 and S3.

Relationship Between Driving Current and Output Power of LD

FIG. 5 illustrates a plot of an example of a relationship between a driving current in the LD and an output power thereof. In FIG. 5, the horizontal axis represents the driving current in mA input to the LD chip 213, and the vertical axis represents the power of light in mW output by the LD chip 213 (LD optical output power).

Light emission characteristics 501 through 505 indicates optical output power characteristics as to how the LD chip 213 is degraded in response to a difference in the driving current of the LD chip 213. The light emission characteristic 501 indicates that the smallest degree of the LD chip 213 is smallest. The light emission characteristic 505 indicates that the degradation of the LD chip 213 has advanced and suffered from a sudden-death. As indicated by the light emission characteristics 501 through 505, the ratio of an optical output power to input driving current of the LD chip 213 becomes smaller as the degradation of the LD chip 213 advances further.

Threshold currents Ith1 through Ith5 respectively indicate minimum driving currents at which the LD chip 213 emits light in accordance with the light emission characteristics 501 through 505. Referring to the threshold currents Ith1 through Ith5, the threshold current of the LD chip 213 increases as the degradation of the LD chip 213 advances.

Variation in Threshold Current of LD

Figure 6:
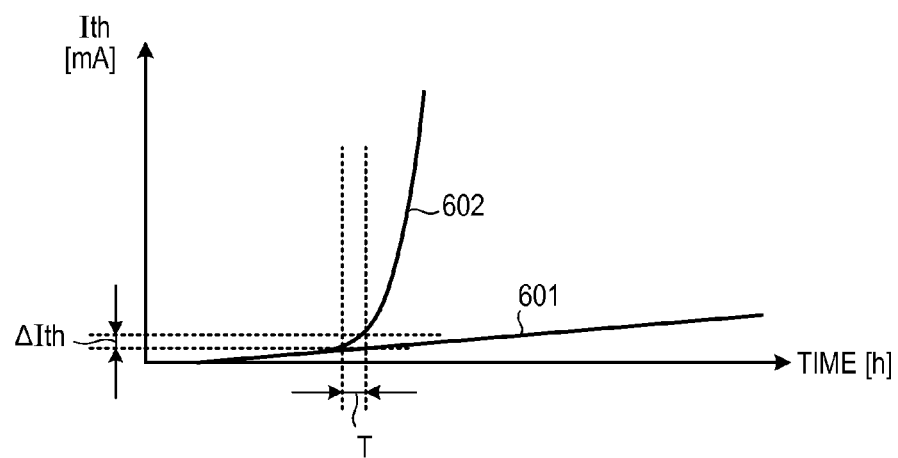
FIG. 6 illustrates a plot of an example of variations in threshold current of the LD.

FIG. 6 illustrates a plot of an example of variations of the threshold current of the LD. Referring to FIG. 6, the horizontal axis represents time in hours and the vertical axis represents a threshold current Ith of the LD chip 213 in mA. A threshold current variation 601 indicates a variation in the threshold current of the LD chip 213 when the LD chip 213 gradually degrades without suffering from a sudden-death. A threshold current variation 602 indicates a variation in the threshold current of the LD chip 213 when the LD chip 213 suffers from a sudden-death.

The threshold current variation 602 in the driving current the LD chip 213 sharply increases when the LD chip 213 comes to a sudden-death. The optical transmitting device 200 calculates a variation ΔIth in the driving current of the threshold current variation 602 during a specific period T, and compares the variation ΔIth with a specific value in order to detect a precursor of the sudden-death of the LD chip 213.

Calculation of Threshold Current

Figure 7:
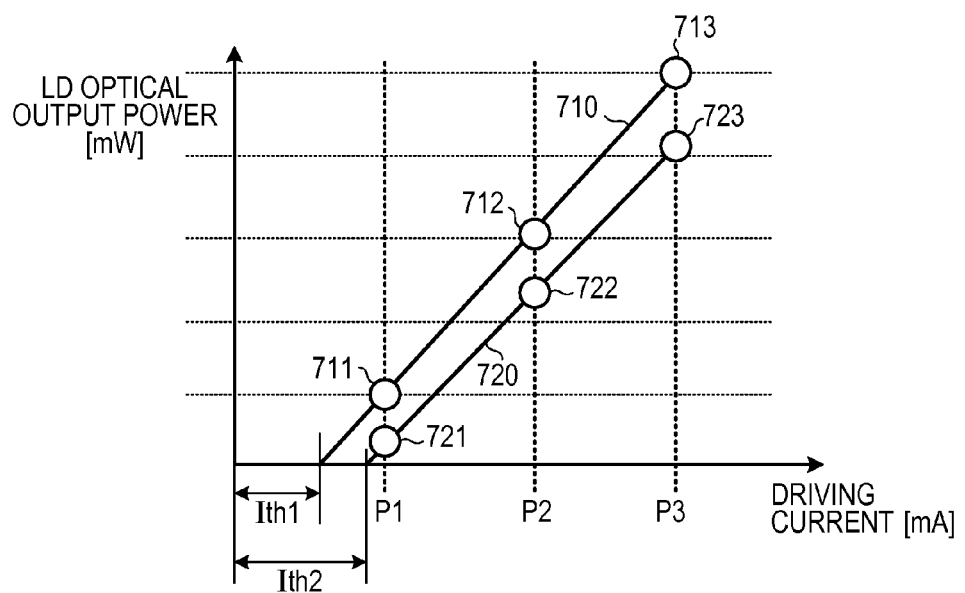
FIG. 7 is a graph to calculate the threshold current.

FIG. 7 is a graph to calculate the threshold current. As illustrated in FIG. 7, the horizontal axis represents the driving current in mA input to the LD chip 213 and the vertical axis represents the power of light in mW output from the LD chip 213 (LD optical output power).

As illustrated in FIG. 7, the optical transmitting device 200 inputs driving currents P1 through P3 (P1<P2<P3) to the LD chip 213 to cause the LD chip 213 to emit faint light S1 through S3 during the no-transmission period (see FIG. 4B through FIG. 4H).

Monitoring results 711 through 713 indicate optical output power of the LD chip 213 monitored by the optical current monitor 232 when the LD chip 213 is caused to emit faint light in response to the driving currents P1 through P3 during a first no-transmission period.

Through extrapolation, the optical transmitting device 200 calculates emission characteristic 710 of the LD chip 213 during the first no-transmission period in accordance with the driving currents P1 through P3 and the monitoring results 711 through 713. Also, the optical transmitting device 200 calculates the threshold current Ith1 of the LD chip 213 during the first no-transmission period in accordance with the calculated light emission characteristic 710.

Monitoring results 721 through 723 indicate optical output power of the LD chip 213 monitored by the optical current monitor 232 when the LD chip 213 is caused to emit faint light in response to the driving currents P1 through P3 during a second no-transmission period subsequent to the first no-transmission period.

Through extrapolation, the optical transmitting device 200 calculates emission characteristic 720 of the LD chip 213 during the second no-transmission period in accordance with the driving currents P1 through P3 and the monitoring results 721 through 723. Also, the optical transmitting device 200 calculates the threshold current Ith2 of the LD chip 213 during the second no-transmission period in accordance with the calculated light emission characteristic 720.

The optical transmitting device 200 detects a precursor of a sudden-death of the LD chip 213 by comparing the calculated threshold current Ith1 and threshold current Ith2. If Ith2−Ith1≥Ith1/10 holds, the optical transmitting device 200 determines that a precursor of a sudden-death of the LD chip 213 is present, and if Ith2−Ith1<Ith1/10 holds, the optical transmitting device 200 determines that a precursor of a sudden-death of the LD chip 213 is not present.

More specifically, the optical transmitting device 200 detects a precursor of a sudden-death of the LD chip 213 depending on whether the difference between the threshold current Ith1 and the threshold current Ith2 is above a specific value responsive to the threshold current Ith1. The optical transmitting device 200 thus predicts a sudden-death of the LD chip 213 accurately.

Configuration of LD Chip

Figure 8A:
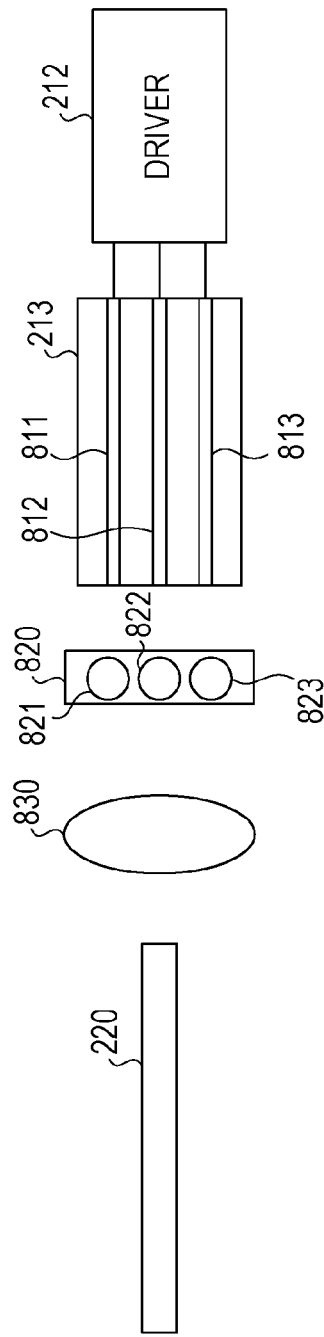
FIG. 8A illustrates an example of the configuration of the LD chip.
Figure 8B:
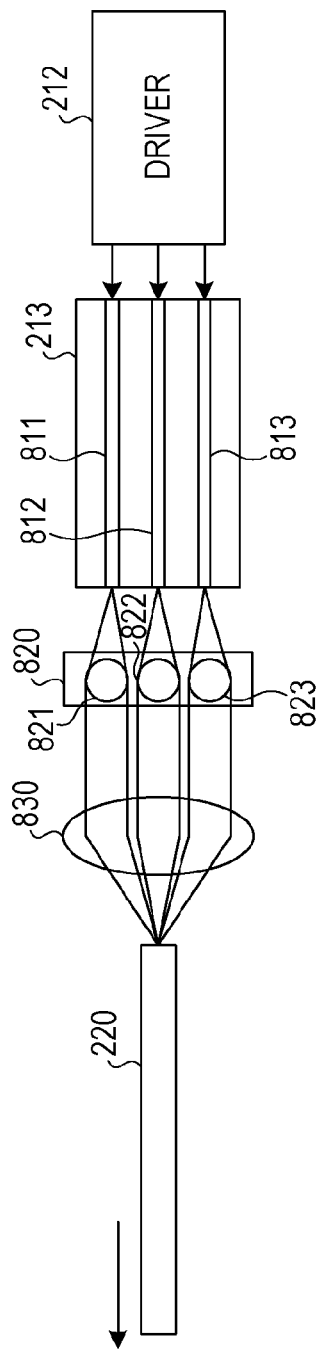
FIG. 8B illustrates an example of a signal flow in the configuration of the LD chip of FIG. 8A.

FIG. 8A illustrates an example of the configuration of the LD chip. FIG. 8B illustrates an example of a signal flow in the configuration of the LD chip of FIG. 8A. In FIG. 8A and FIG. 8B, elements identical to those in FIG. 2A and FIG. 2B are designated with the same reference symbols, and the discussion thereof is omitted herein.

As illustrated in FIG. 8A and FIG. 8B, the LD chip 213 includes three active layers, for example. Signal electrodes 811 through 813 are anode (or cathode) electrodes corresponding to the three active layers of the optical filter 313.

The driver 212 inputs the driving current to one of the signal electrodes 811 through 813 to cause one of the active layers of the LD chip 213 to emit light. As illustrated in FIG. 8A and FIG. 8B, a lens array 820 and a condenser lens 830 may be arranged between the LD chip 213 and the optical fiber 220.

The lens array 820 includes microlenses 821 through 823. The microlenses 821 through 823 are arranged in conjunction with the three active layers of the LD chip 213. The microlenses 821 through 823 collimate light output from the corresponding active layers and then output the collimated light to the condenser lens 830. The condenser lens 830 condenses light output from each of the microlenses 821 through 823 onto the optical fiber 220.

An aspherical lens or the like may be substituted for the lens array 820 and the condenser lens 830 to condense the light onto the optical fiber 220. The aspherical lens having parallax controlled is arranged at a location where each beam of light output from the three active layers of the LD chip 213 passes.

Configuration of Driver and LC Chip

Figure 9A:
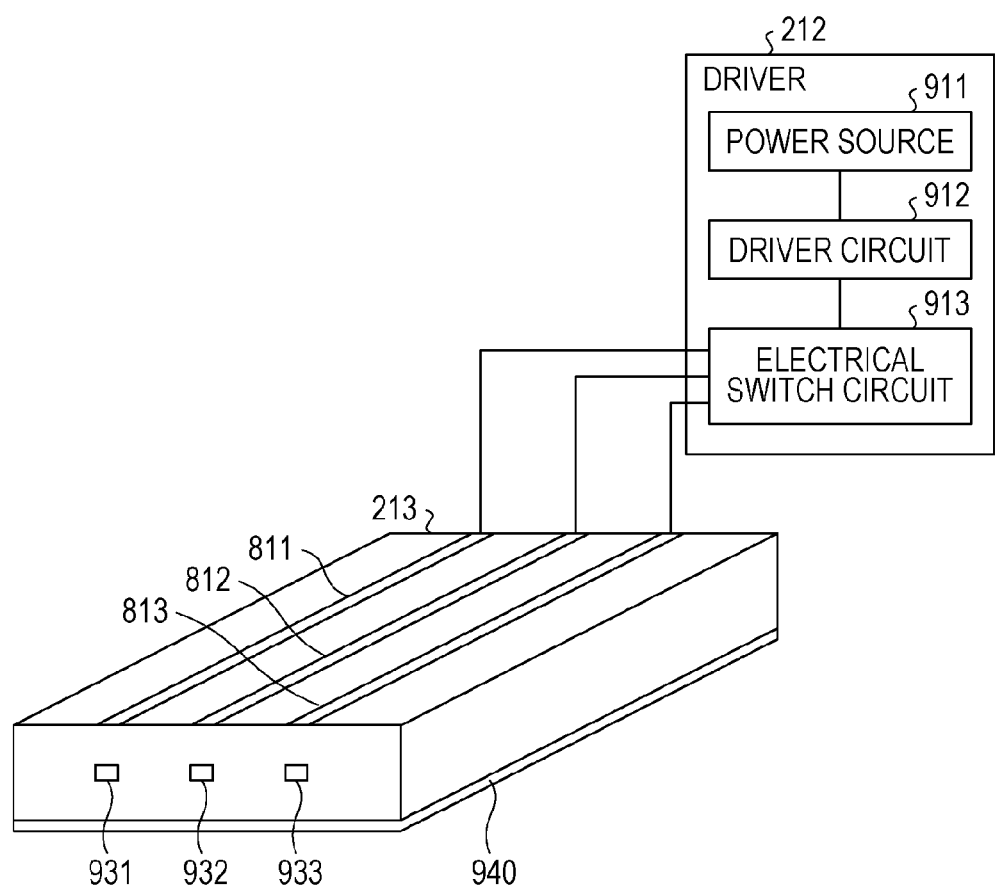
FIG. 9A illustrates an example of a configuration of a driver and an LD chip.

FIG. 9A illustrates an example of a configuration of a driver and an LD chip. FIG. 9B illustrates an example of a signal flow in the configuration of the driver and the LD chip of FIG. 9A. In FIG. 9A and FIG. 9B, elements identical to those in FIG. 8A and FIG. 8B are designated with the same reference symbols, and the discussion thereof is omitted herein.

As illustrated in FIG. 9A and FIG. 9B, the driver 212 includes a power source 911, a driver circuit 912, and an electrical switch circuit 913. The power source 911 supplies power to generate the driving current. The driver circuit 912, operated from power supplied from the power source 911, generates the driving current in response to input signal data or emission instruction information. The driver circuit 912 outputs the generated driving current to the electrical switch circuit 913.

The electrical switch circuit 913 applies the driving current output from the driver circuit 912 to one of the signal electrodes 811 through 813 of the LD chip 213. Upon receiving switching instruction information, the electrical switch circuit 913 switches from one signal electrode to another among the signal electrodes 811 through 813 as the signal electrode that is to receive the driving current.

The LD chip 213 includes signal electrodes 811 through 813, active layers 931 through 933, and a ground electrode 940. The signal electrodes 811 through 813 are arranged in one surface of the LD chip 213. The driver 212 supplies driving currents to the signal electrodes 811 through 813. The ground electrode 940 is arranged on another surface of the LD chip 213 opposite the surface having the signal electrodes 811 through 813.

The active layers 931 through 933 are respectively arranged between the signal electrodes 811 through 813 and the ground electrode 940. The active layers 931 through 933 emit light one time in response to the driving currents, respectively applied to the signal electrodes 811 through 813. The light beam emitted from each of the active layers 931 through 933 is incident on the lens array 820 as illustrated in FIG. 8A and FIG. 8B. The LD chip 213 of FIG. 9A and FIG. 9B includes three LDs including the signal electrodes 811 through 813, the active layers 931 through 933, and the ground electrode 940.

Configuration of Electrical Switch Circuit

FIG. 10A illustrates an example of a configuration of the electrical switch circuit 913. As illustrated in FIG. 10A, the electrical switch circuit 913 of FIG. 9A and FIG. 9B includes input terminals 1011 and 1012, switching circuit 1013, transistors Tr1 through Tr3, and resistors R1 through R3.

The input terminal 1011 receives the driving current from the driver circuit 912 (see FIG. 9A and FIG. 9B). The input terminal 1012 receives the switching instruction information from the characteristics degradation detection controller 241 (see FIG. 2A and FIG. 2B).

The transistors Tr1 through Tr3 may be implemented by a field effect transistor (FET). The transistor Tr1 has a gate connected to the switching circuit 1013, a drain connected to the input terminal 1011, and a source connected to the resistor R1. The transistor Tr2 has a gate connected to the switching circuit 1013, a drain connected to the input terminal 1011, and a source connected to the resistor R2. The transistor Tr3 has a gate connected to the switching circuit 1013, a drain connected to the input terminal 1011, and a source connected to the resistor R3.

The resistor R1 has one terminal connected to the transistor Tr1 and the other terminal connected to an electrode 1031. The resistor R2 has one terminal connected to the transistor Tr2 and the other terminal connected to an electrode 1032. The resistor R3 has one terminal connected to the transistor Tr3 and the other terminal connected to an electrode 1033.

The electrodes 1031 through 1033 of FIG. 10A respectively correspond to the signal electrodes 811 through 813 of FIG. 9A and FIG. 9B. LDs 1041 through 1043 respectively correspond to the active layers 931 through 933 of FIG. 9A and FIG. 9B. The ground 1040 corresponds to the ground electrode 940 of FIG. 9A and FIG. 9B.

The switching circuit 1013 switches from one voltage to another as a voltage to apply to each of the gates of the transistors Tr1 through Tr3 in response to the switching instruction information input via the input terminal 1012. The operation of the switching circuit 1013 is described below.

FIG. 10B illustrates an example of an operation of the switching circuit 1013 of the electrical switch circuit. The switching circuit 1013 of the electrical switch circuit 913 of FIG. 10A operates in accordance with a state table 1050 of FIG. 10B, for example.

In the state table 1050, voltages to be applied to the gates of the transistors Tr1 through Tr3 are associated with "state 1", "state 2", and "state 3". In the state table 1050, a label "H" represents a high voltage to be applied (for on), and a label "L" represents a low voltage to be applied (for off).

The switching circuit 1013 may now be set to be in the "state 1" in the initial state thereof. In such a case, the switching circuit 1013 sets the voltage to be applied to the gate of the transistor Tr1 to be high, and the voltages to be applied to the gates of the transistors Tr2 and Tr3 to be low. In this way, the driving current input to the input terminal 1011 is applied to the electrode 1031, causing the LD 1041 (the active layer 931) to emit light.

The switching circuit 1013 shifts to the "state 2" when the switching instruction information is input via the input terminal 1012 in the "state 1". The switching circuit 1013 sets the voltage applied to the gate of the transistor Tr2 to be high, and sets the voltages applied to the transistors Tr1 and Tr3 to be low. In this way, the driving current input via the input terminal 1011 is applied to the electrode 1032, causing the LD 1042 (the active layer 932) to emit light.

The switching circuit 1013 shifts to the "state 3" when the switching instruction information is input via the input terminal 1012 in the "state 2". The switching circuit 1013 sets the voltage applied to the gate of the transistor Tr3 to be high, and sets the voltages applied to the transistors Tr1 and Tr2 to be low. In this way, the driving current input via the input terminal 1011 is applied to the electrode 1033, causing the LD 1043 (the active layer 933) to emit light.

The electrical switch circuit 913 inputs the driving current output from the driver circuit 912 to one of the signal electrodes 811 through 813 of the LD chip 213, and switches from one signal electrode to another to receive the driving current if the switching instruction information is received.

Operation of Optical Transmitting Device of Second Embodiment

Figure 11:
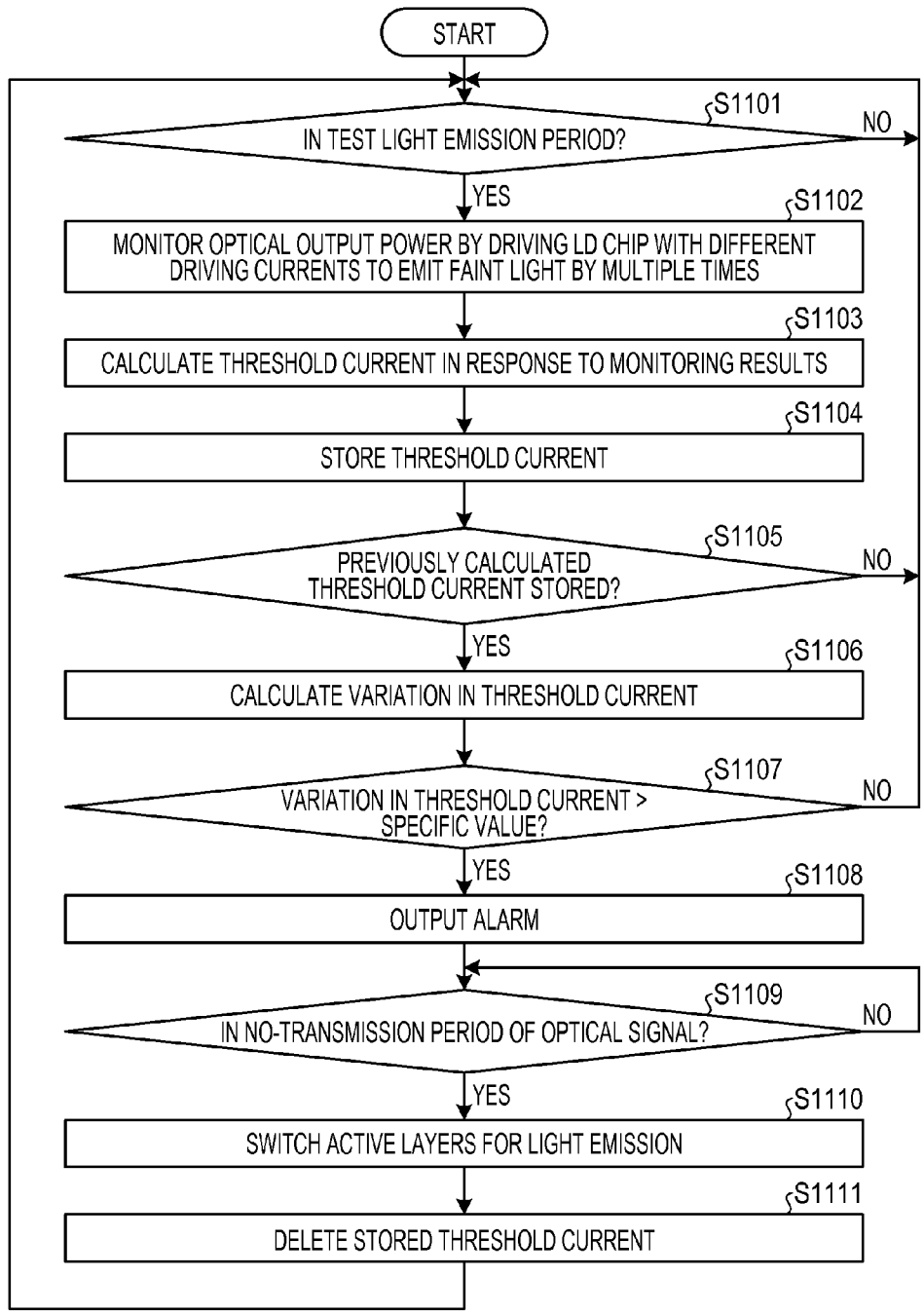
FIG. 11 is a flowchart illustrating an example of an operation of the optical transmitting device of a second embodiment.

FIG. 11 is a flowchart illustrating an example of an operation of the optical transmitting device of the second embodiment. The optical transmitting device 200 performs the following operations. The optical transmitting device 200 determines whether it is in a specific test light emission period (operation S1101). If not, the optical transmitting device 200 waits on standby until it is in a specific test light emission period (no loop from operation S1101).

The test light emission period is periodic and a no-transmission period throughout which the optical transmitting device 200 transmits no optical signal. For example, the optical transmitting device 200 selects, as the test light emission period, periodic durations within the no-transmission period different from the transmission period indicated by the acquired transmission period information.

If it is in a specific test light emission period (yes loop from operation S1101), the optical transmitting device 200 causes the LD chip 213 to emit faint light by multiple times in response to different driving currents, and then monitors the optical output power of the LD chip 213 (operation S1102). The optical transmitting device 200 then calculates the threshold current of the LD chip 213 in response to the monitoring results obtained in operation S1102 (operation S1103).

The optical transmitting device 200 causes the threshold current storage unit 243 to store the threshold current calculated in operation S1103 (operation S1104). The optical transmitting device 200 determines whether the threshold current calculated in the previous series of operations is stored on the threshold current storage unit 243 (operation S1105). If the previous threshold value is not stored (no loop from operation S1105), the optical transmitting device 200 returns to operation S1101.

If the previous threshold current is stored (yes loop from operation S1105), the optical transmitting device 200 proceeds to operation S1106. More specifically, the optical transmitting device 200 calculates a variation to the threshold current calculated in operation S1103 with reference to the previous threshold current stored on the threshold current storage unit 243 (operation S1106).

The optical transmitting device 200 determines whether the variation in the threshold current calculated in operation S1106 is above a specific value (operation S1107). If it is determined in step S1107 that the variation in the threshold current is not above the specific value (no loop from operation S1107), the optical transmitting device 200 determines that no precursor of a sudden-death is present in the active layer of the LD chip 213 currently emitting light. The optical transmitting device 200 returns to operation S1101.

If it is determined in operation S1107 that the variation in the threshold current is above the specific value (yes loop from operation S1107), the optical transmitting device 200 determines that a precursor of a sudden-death is preset in the active layer of the LD chip 213 currently emitting light. In such a case, the optical transmitting device 200 outputs an alarm notifying a maintenance person that a precursor of a sudden-death is present in the active layer of the LD chip 213 currently emitting light (operation S1108).

The optical transmitting device 200 determines whether it is in the no-transmission period of the optical signal of the optical transmitting device 200 (operation S1109). If not, the optical transmitting device 200 waits on standby until it is in the no-transmission period (no loop from operation S1109). The optical transmitting device 200 selects an active layer to emit light by switching one active layer to another from among the active layers of the LD chip 213 (operation S1110). The optical transmitting device 200 deletes the threshold current stored on the threshold current storage unit 243 (operation S1111), and then returns to operation S1101.

Through the operations, the optical transmitting device 200 periodically measures the threshold current of the LD chip 213 during the no-transmission period of the optical transmitting device 200, and outputs an alarm if the variation in the measured threshold current exceeds the specific value. If the variation in the measured threshold current exceeds the specific value, the optical transmitting device 200 select an active layer to emit light from among the active layers of the LD chip 213 by switching one active layer to another. The switching of the active layer during the no-transmission period of the optical signal avoids interrupting the transmission of the optical signal.

Configuration of LD Chip and PD Chip

Figure 12A:
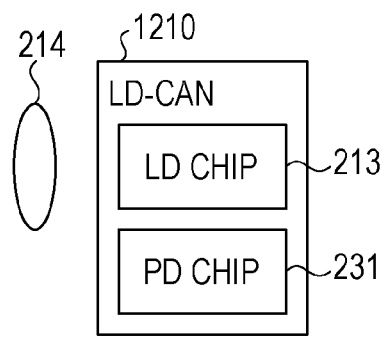
FIG. 12A illustrates an example of a configuration of an LD chip and a photo diode (PD) chip.

FIG. 12A illustrates an example of a configuration of an LD chip and a PD chip. As illustrated in FIG. 12A, elements identical to those illustrated in FIG. 2A and FIG. 2B are designated with the same reference symbols and the discussion thereof is omitted herein. As illustrated in FIG. 12A, the LD chip 213 and the PD chip 231 may be contained in the package of LD-CAN 1210.

The lens 214 may allow both the light emitted from the LD chip 213 and the light incident on the PD chip 231 to be transmitted therethrough. Alternatively, a lens, separate from the lens 214 that transmits the light emitted from the LD chip 213, may be arranged to transmit the light incident on the PD chip 231.

Figure 12B:
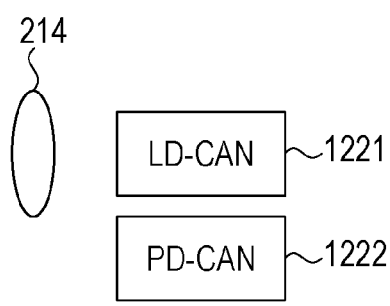
FIG. 12B illustrates another example of the configuration of the LD chip and the PD chip.

FIG. 12B illustrates another example of a configuration of the LD chip and the PD chip. As illustrated in FIG. 12B, elements identical to those illustrated in FIG. 2A and FIG. 2B are designated with the same reference symbols and the discussion thereof is omitted herein. As illustrated in FIG. 12B, the LD chip 213 and the PD chip 231 may be implemented by CAN packages, LD-CAN 1221 and PD-CAN 1222, respectively.

The lens 214 may allow both the light emitted from the LD-CAN 1221 and the PD-CAN 1222 to be transmitted therethrough. Alternatively, a lens, separate from the lens 214 that transmits the light emitted from the LD-CAN 1221, may be arranged to transmit the light incident on the PD-CAN 1222.

The optical transmitting device 200 of the second embodiment causes the LD chip 213 to emit faint light with the magnitude of the driving current changing during the periodic duration throughout which no optical signal is transmitted, and then measures the threshold current of the LD chip 213. The optical transmitting device 200 may thus detect a sharp change in the threshold current. The optical transmitting device 200 determines the presence or absence of a precursor of a sudden-death of the LD chip 213 without interrupting the operation of optical communications.

If the LD that is in service of the transmission of the optical signal comes to a sudden-death, the optical transmitting device suffers from a system down, stopping the transmission of the optical signal. In such a case, a maintenance person of the optical transmitting device 110 may check the optical transmitting device 110, identify the sudden-death, and replace the optical transmitting device 110 at fault with a good optical transmitting device 110 for recovery. Time and costs are incurred. In contrast, such a system down is precluded in the optical transmitting device 110 by switching from the LD that has a precursor of a sudden-death to another LD to be used.

A simple configuration to detect a precursor of a sudden-death may be implemented. For example, a PON system, such as a communication system 300, may provide high-reliability services meeting customers' demand in a flexible fashion while maintaining low-cost features of the PON system.

In the above discussion, the optical transmitting device 200 of the second embodiment determines the presence or absence of a precursor of a sudden-death in response to the threshold current of the LD chip 213. The optical transmitting device 200 may determine the presence or absence of a precursor of a sudden-death by accounting for, in addition to the threshold current of the LD chip 213, monitored current and voltage values, a current with small reverse bias applied, front optical output power, back optical output power, and an optical output power ratio of front light to back light of the LD chip 213, and other factors, for example.

Third Embodiment

A third embodiment is described. The discussion of the third embodiment focuses on a difference from the second embodiment.

Figure 13B:
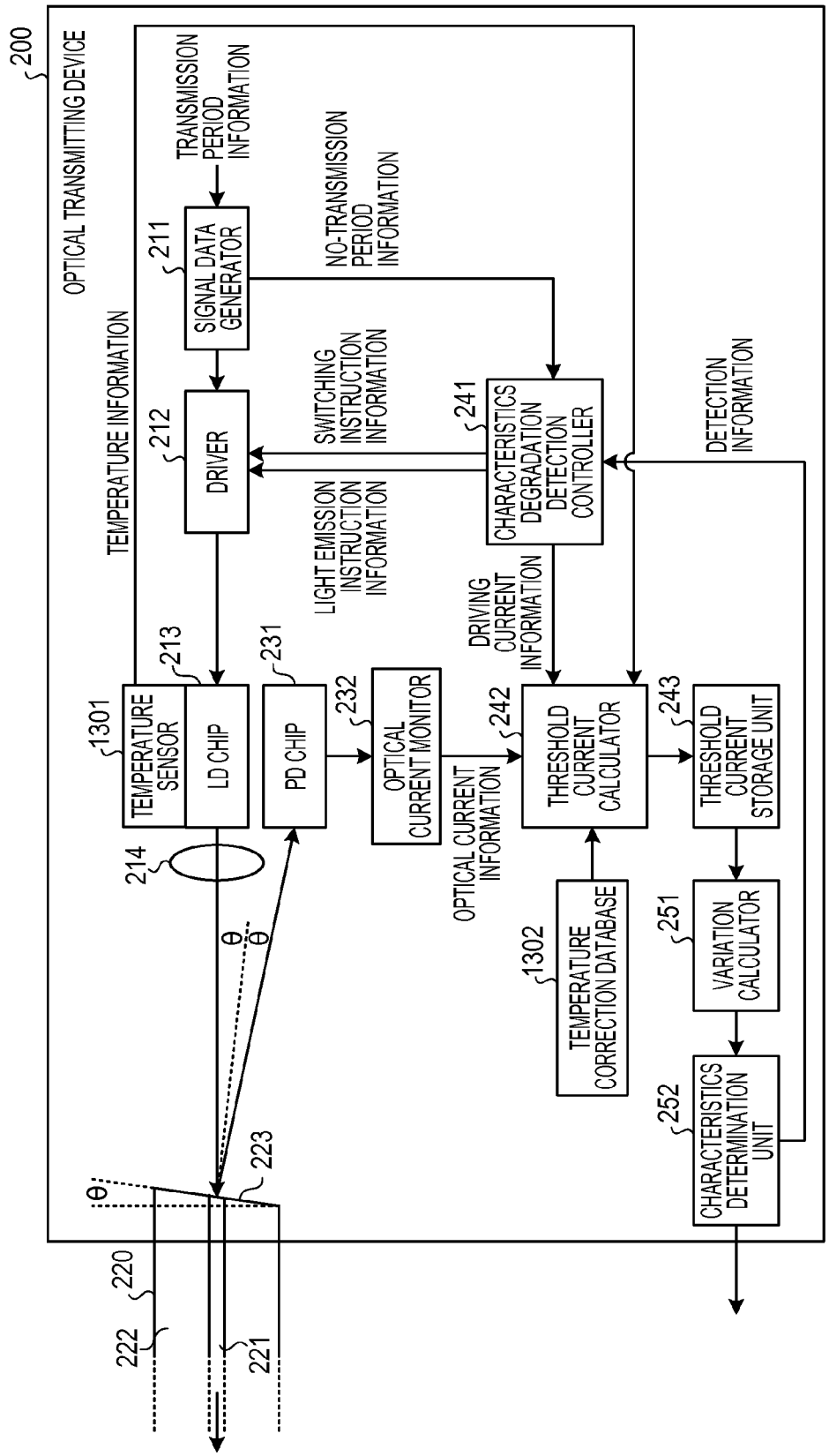
FIG. 13B illustrates a signal flow in the configuration of the optical transmitting device of FIG. 13A.

FIG. 13A illustrates an example of a configuration of the optical transmitting device 200 of the third embodiment. FIG. 13B illustrates a light and electrical signal flow in the configuration of the optical transmitting device 200 of FIG. 13A. As illustrated in FIG. 13A and FIG. 13B, elements identical to those illustrated in FIG. 2A and FIG. 2B are designated with the same reference symbols, and the discussion thereof is omitted herein.

The optical transmitting device 200 of the third embodiment of FIG. 13A and FIG. 13B further includes a temperature sensor 1301 and a temperature correction database 1302 in addition to the configuration of the optical transmitting device 200 of FIG. 2A and FIG. 2B.

The temperature sensor 1301 is arranged close to the LD chip 213 and measures the temperature of the LD chip 213. The temperature sensor 1301 outputs temperature information indicating the measured temperature to the threshold current calculator 242. The temperature sensor 1301 may be implemented by a thermistor or an arrangement that monitors a forward voltage of a diode.

The temperature correction database 1302 is used by the threshold current calculator 242 to calculate the threshold current that is corrected in accordance with the temperature of the LD chip 213. The temperature correction database 1302 is described further below (with reference to FIG. 15 and FIG. 17, for example). The temperature correction database 1302 may be implemented by a non-volatile memory such as EEPROM or a flash memory.

Figures 14, 15:
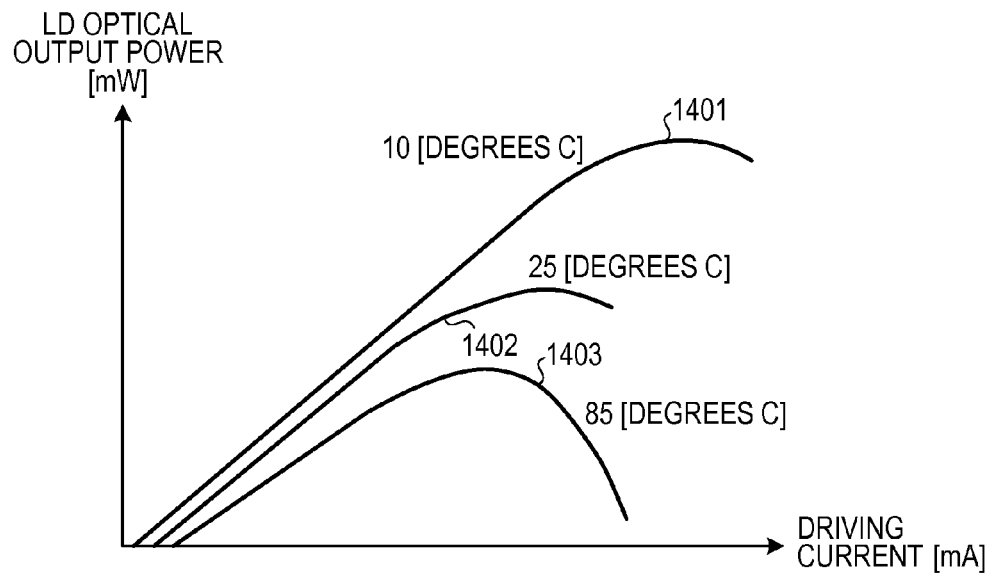
FIG. 14 illustrates a plot of an example of temperature characteristics of LD optical output power with respect to the driving current.
FIG. 15 illustrates an example of a temperature correction database.

Temperature Characteristics of LD Optical Output Power with Respect to Driving Current FIG. 14 illustrates a plot of an example of temperature characteristics of LD optical output power with respect to the driving current. As illustrated in FIG. 14, the horizontal axis represents the driving current in mA input to the LD chip 213 and the vertical axis represents the power of light in mW output from the LD chip 213 (LD optical output power). Light emission characteristics 1401 through 1403 represent characteristics of optical output power in response to the driving current to the LD chip 213 with the temperature of the LD chip 213 being 10 degrees C., 25 degrees C., and 85 degrees C.

As represented by the light emission characteristics 1401 through 1403, the LD chip 213 provides a smaller ratio of the optical output power to the input driving current as the temperature rises. The optical output power responsive to the driving current of the LD chip 213 (efficiency) varies depending on the ambient temperature. In contrast, the optical transmitting device 200 discriminates a variation in the threshold current responsive to a variation in the temperature of the LD chip 213 by calculating the threshold current corrected in accordance with the temperature of the LD chip 213, and thus monitors a variation in the threshold current responsive to a degradation of the LD chip 213. The optical transmitting device 200 accurately predicts a precursor of a sudden-death of the LD chip 213. Calculation example 1 of threshold current corrected in accordance with temperature FIG. 15 illustrates an example of a temperature correction database. The temperature correction database 1302 of FIG. 13A and FIG. 13B includes a temperature correction table 1500 of FIG. 15 on each of the active layers of the LD chip 213.

The temperature correction table 1500 lists the relationship at an initial state of the LD chip 213 between the driving current in mA input to the LD chip 213, the power of light in mW emitted from the LD chip 213, and the temperature in degrees C. of the LD chip 213. Each temperature listed in the temperature correction table 1500 may be within a practical temperature range within which the LD chip 213 operates.

Figures 16, 17:
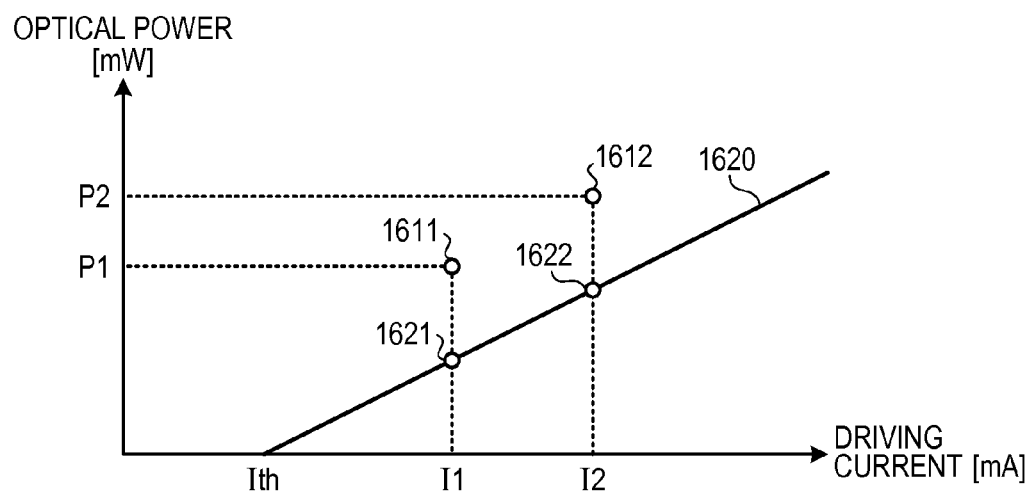
FIG. 16 illustrates a calculation example of the threshold current corrected in accordance with temperature.
FIG. 17 illustrates another example of the temperature correction database.

FIG. 16 illustrates a calculation example of the threshold current corrected in accordance with temperature. As illustrated in FIG. 16, the horizontal axis represents the driving current in mA input to the LD chip 213 and the power of light in mW emitted from the LD chip 213 (optical power).

A monitoring result 1611 indicates a measurement result P1 of the optical power at a driving current I1 with the temperature of the LD chip 213 at 50 degrees C. The threshold current calculator 242 acquires the optical power responsive to a combination of 50 degrees C. and the driving current I1 in the temperature correction table 1500 of FIG. 15. For example, if the driving current I1 is 2 mA, optical power responsive to a combination of 50 degrees C. and 2 mA in the temperature correction table 1500 is A2.

If optical power responsive to a combination of 50 degrees and the threshold current I1 is not found in the temperature correction table 1500, the threshold current calculator 242 acquires corresponding optical power using linear approximation of data in the temperature correction table 1500.

The threshold current calculator 242 acquires optical power responsive to specific rated temperature and the driving current I1 in the temperature correction table 1500. For example, if the rated temperature is 60 degrees C. and the driving current I1 is 2 mA, the threshold current calculator 242 acquires optical power A3 responsive to a combination of 60 degrees C. and 2 mA in the temperature correction table 1500.

If optical power responsive to the rated temperature and the driving current I1 is not available in the temperature correction table 1500, the threshold current calculator 242 acquires the optical power using linear approximating of the data of the temperature correction table 1500.

The threshold current calculator 242 may correct the monitoring result 1611 in accordance with temperature by multiplying a ratio of acquired optical power A3 and A2 (A3/A2) by the measured optical power P1. A correction value 1621 is a value that is corrected in accordance with the temperature of the monitoring result 1611.

A monitoring result 1612 represents a measurement result P2 of the optical power at the driving current I2 (>I1) with the temperature of the LD chip 213 at 50 degrees C. The threshold current calculator 242 corrects the monitoring result 1612 in accordance with temperature in the same way the monitoring result 1611 is corrected. A correction value 1622 is a value that results from correcting the monitoring result 1612 in accordance with temperature.

Through extrapolation, the threshold current calculator 242 calculates a light emission characteristic 1620 of the LD chip 213 in accordance with the correction values 1621 and 1622 corrected by the monitoring results 1611 and 1612. The threshold current calculator 242 calculates the threshold current Ith of the LD chip 213 in accordance with the calculated light emission characteristic 1620.

The threshold current calculator 242 calculates the threshold current in accordance with the temperature measured by the temperature sensor 1301 and the temperature correction table 1500 that lists the relationship on the temperature of the LD chip 213 between the driving current and the intensity of the output light of the LD chip 213.

Calculation Example 2 of Threshold Current Corrected in Accordance with Temperature FIG. 17 illustrates another example of the temperature correction database. The temperature correction database 1302 of FIG. 13A and FIG. 13B may include a temperature correction table 1700 of FIG. 17 on each of the active layers of the LD chip 213. The temperature correction table 1700 lists the relationship at the initial state of the LD chip 213 between the temperature of the LD chip 213 in degrees C. and the threshold current of the LD chip 213.

Figure 18:
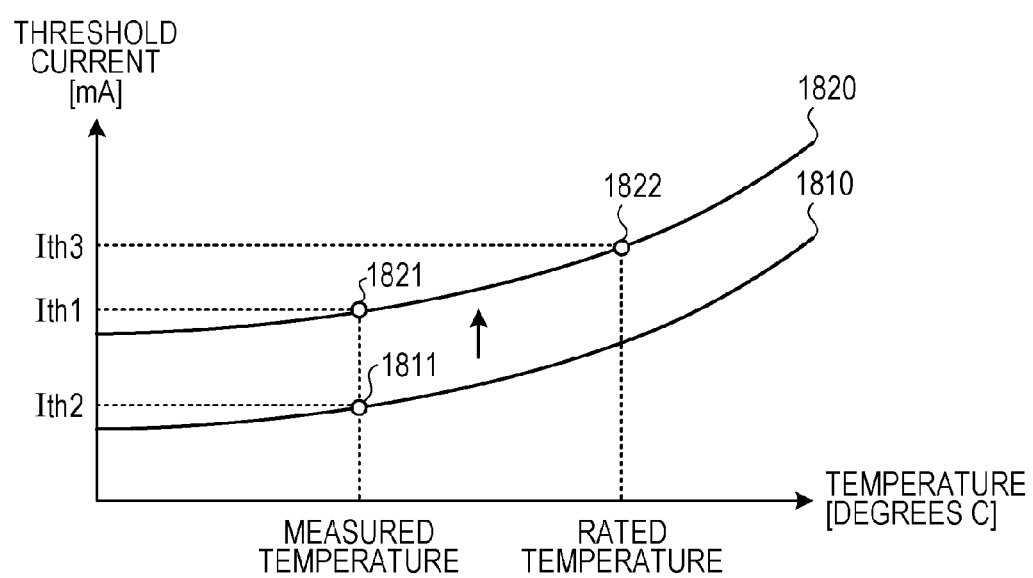
FIG. 18 illustrates another calculation example of the threshold current corrected in accordance with temperature.

FIG. 18 illustrates another calculation example of the threshold current corrected in accordance with temperature. In FIG. 18, the horizontal axis represents the temperature of the LD chip 213 in degrees C., and the vertical axis represents the threshold current of the LD chip 213 in mA.

A threshold value characteristic 1810 represents characteristic of the threshold current of the LD chip 213 with temperature listed in the temperature correction table 1700 of FIG. 17. A threshold value characteristic 1821 represents a calculation result (Ith1) of the threshold current in response to measurement results of the driving current and the optical power with the temperature of the LD chip 213 being at 50 degrees C.

The threshold current calculator 242 calculates a difference (Ith1−Ith2) between the threshold current (Ith2) of the threshold value characteristic 1810 at 50 degrees C. and the threshold current (Ith1) represented by the threshold value characteristic 1821. The threshold current calculator 242 obtains a threshold value characteristic 1820 by adding the calculated difference in the threshold current to the threshold value characteristic 1810. The threshold current calculator 242 calculates the threshold current corrected in accordance with temperature by determining a threshold current 1822 corresponding to a rated temperature along the threshold value characteristic 1820.

The threshold current calculator 242 calculates a corrected threshold current in accordance with the temperature measured by the temperature sensor 1301 and the temperature correction table 1700 that lists the relationship between the threshold current and temperature of the LD chip 213.

Operation of Optical Transmitting Device of Third Embodiment

Figure 19:
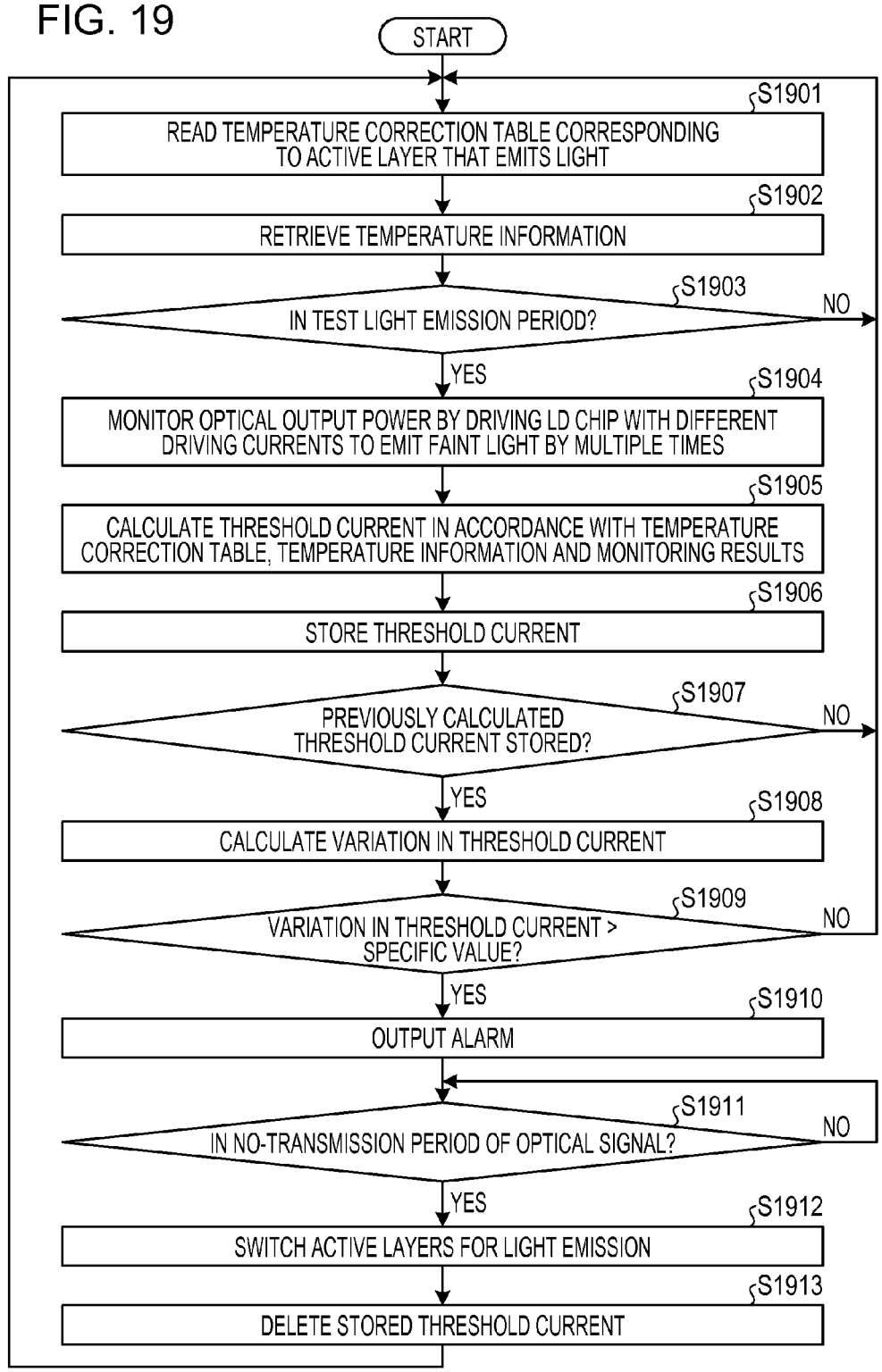
FIG. 19 is a flowchart illustrating an example of an operation of the optical transmitting device of the third embodiment.

FIG. 19 is a flowchart illustrating an example of an operation of the optical transmitting device of the third embodiment. The optical transmitting device 200 performs the following operations. The optical transmitting device 200 reads the temperature correction table corresponding to the active layer currently emitting light from among the three active layers of the LD chip 213 (operation S1901).

The optical transmitting device 200 retrieves temperature information acquired by the temperature sensor 1301 (operation S1902). Operations S1903 through S1913 of FIG. 19 are identical to operations S1101 through S1111 of FIG. 11, respectively. In operation S1905, however, the optical transmitting device 200 calculates the threshold current of the LD chip 213 in accordance with the temperature correction table read in operation S1901, the temperature information retrieved in operation S1902, and the monitoring result in operation S1904.

Through the operations, the optical transmitting device 200 measures the threshold current of the LD chip 213 during the no-transmission period of the optical transmitting device 200, and outputs an alarm if the variation in the measured threshold current exceeds the specific value. If the variation in the measured threshold current exceeds the specific value, the optical transmitting device 200 selects one of the active layers of the LD chip 213 to emit light by switching. The optical transmitting device 200 calculates the threshold current corrected in accordance with the temperature of the LD chip 213.

The optical transmitting device 200 of the third embodiment discriminates a variation in the threshold current responsive to a variation in the temperature of the LD chip 213 by calculating the threshold current corrected in accordance with the temperature of the LD chip 213, and thus monitors a variation in the threshold current responsive to a degradation of the LD chip 213. The optical transmitting device 200 accurately predicts a precursor of a sudden-death of the LD chip 213.

Fourth Embodiment

A fourth embodiment is described below. The following discussion of the fourth embodiment focuses on a difference from the second embodiment.

Configuration of Optical Transmitting Device of Fourth Embodiment

Figure 20A:
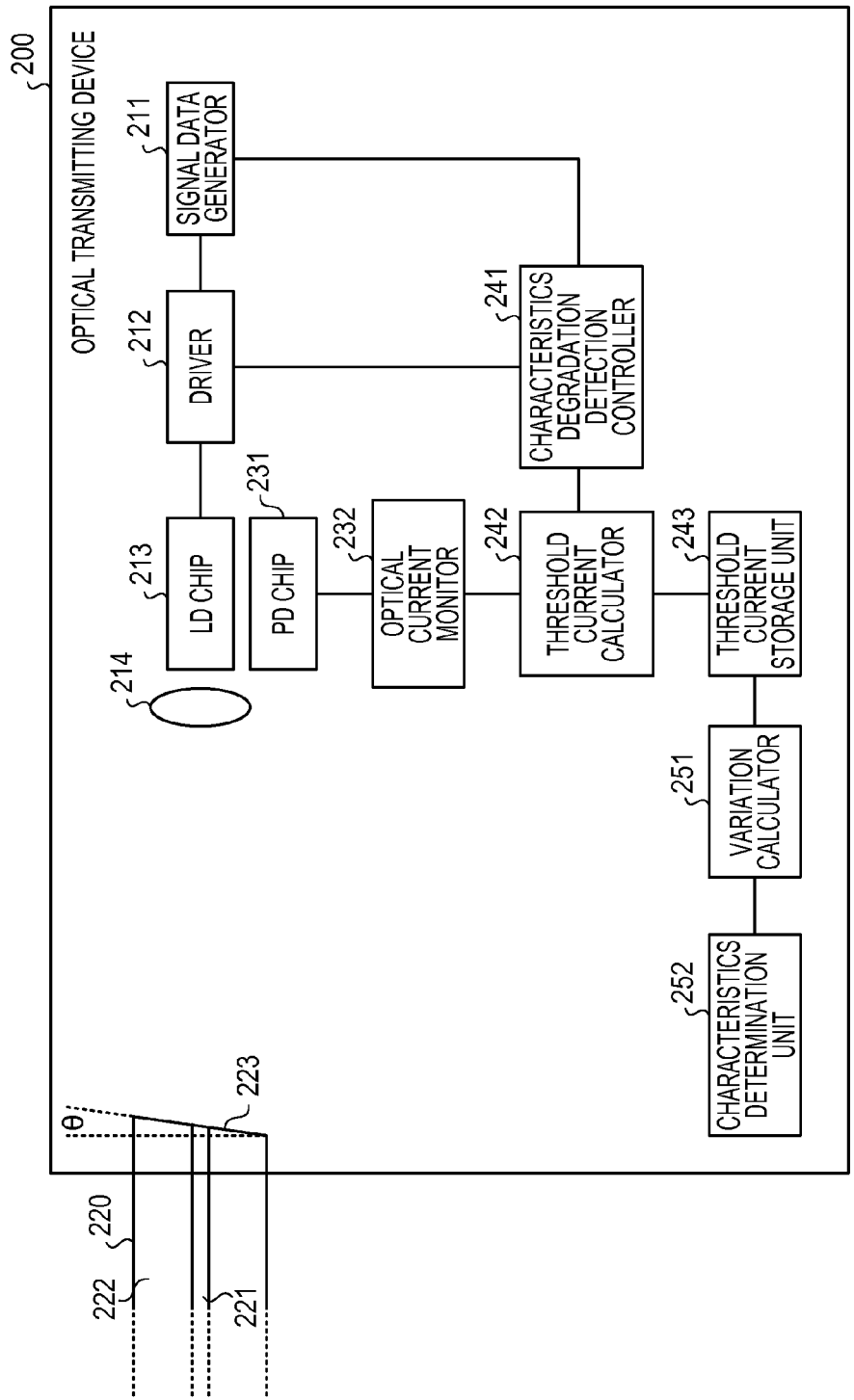
FIG. 20A illustrates an example of a configuration of the optical transmitting device of a fourth embodiment.
Figure 20B:
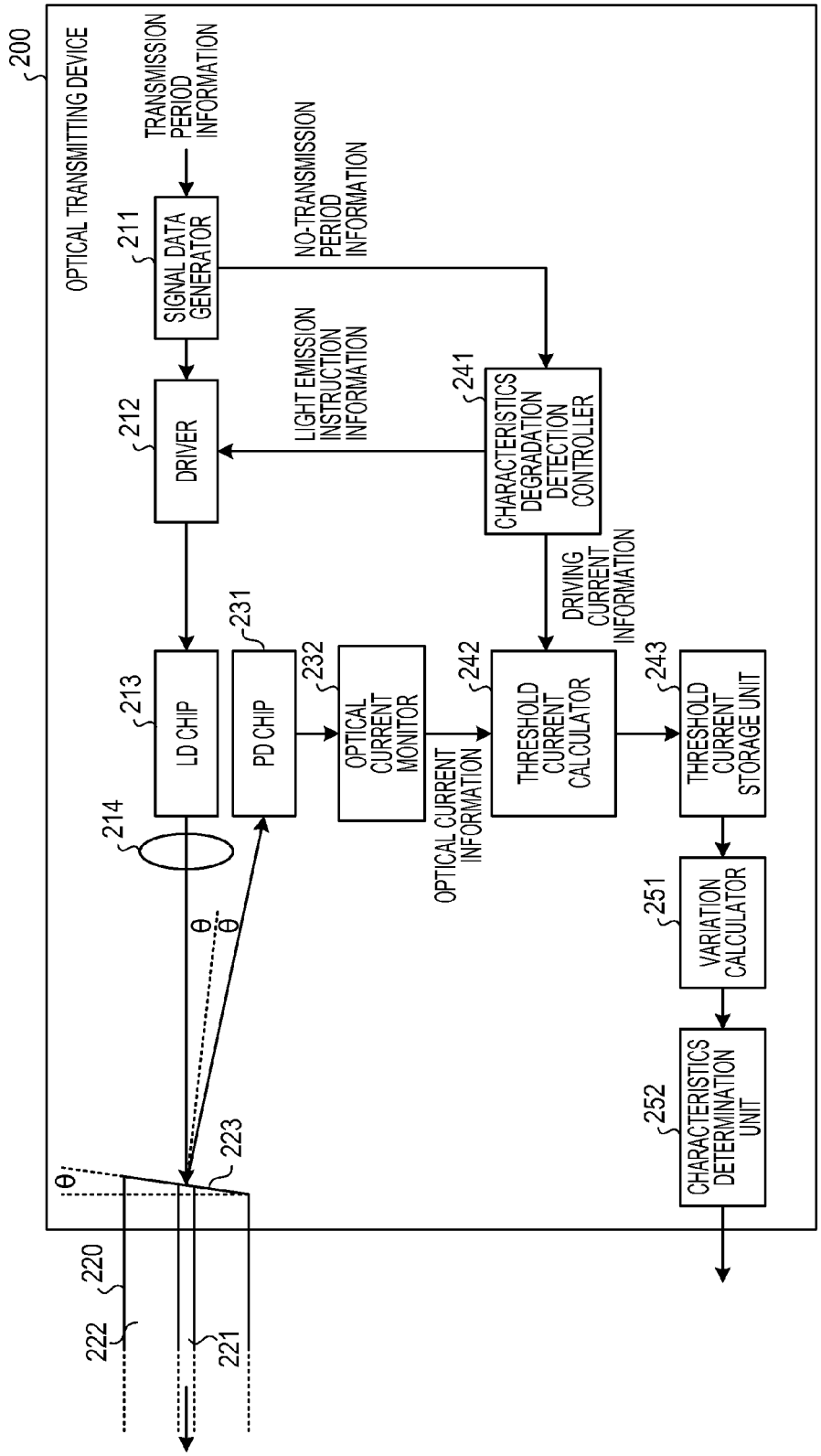
FIG. 20B illustrates an example of a signal flow in the configuration of the optical transmitting device of FIG. 20A.

FIG. 20A illustrates an example of a configuration of the optical transmitting device of the fourth embodiment. FIG. 20B illustrates an example of a signal flow in the configuration of the optical transmitting device of FIG. 20A. As illustrated in FIG. 20A and FIG. 20B, elements identical to those illustrated in FIG. 2A and FIG. 2B are designated with the same reference symbols and the discussion thereof is omitted herein.

As illustrated in FIG. 20A and FIG. 20B, the optical transmitting device 200 of the fourth embodiment does not output detection information to the characteristics degradation detection controller 241 even if the characteristics determination unit 252 of FIG. 2A and FIG. 2B determines that a precursor of a sudden-death is present. In such a case, the characteristics degradation detection controller 241 does not output the switching instruction information to the driver 212. The LD chip 213 may be of an LD that includes only a single active layer.

In this case as well, the optical transmitting device 200 outputs an alarm notifying the maintenance person of the optical transmitting device 200 that a precursor of a sudden-death is present. The arrangement may still allow the maintenance person to be prepared for a sudden-death of the LD chip 213. For example, the maintenance person may replace the LD chip 213.

The optical transmitting device 200 causes the LD 213 to emit faint light with the magnitude of the driving current varied during a periodic duration during which the optical transmitting device 200 transmits no optical signal and measures the threshold current of the LD 213. The optical transmitting device 200 may thus detect a sharp change in the threshold current. The optical transmitting device 200 thus determines the presence or absence of the precursor of a sudden-death of the LD 213 without stopping the operation of an optical communication.

As described above, the optical transmitting device and the optical transmission system early predicts the precursor of a sudden-death of the laser diode.

An arrangement that monitors the back light of the LD chip 213 is unable to monitor a variation in the power of the front light caused by a degradation of the LD chip 213. In contrast, the optical transmitting device 200 monitors the light reflected from the end face 223 of the optical fiber 220, and monitors a variation in the power of the front light caused by a degradation of the LD chip 213. The optical transmitting device 200 may thus detect a precursor of a sudden-death.

The embodiments may be applicable to a technique of monitoring the back light of an LD chip. The embodiments are not limited to the front light. However, monitoring the optical power of the front light results in a higher monitoring accuracy, in other words, provides a higher calculation level of the threshold value. This is because the front light is typically designed to be output at a higher power level than the back light.

In comparison with the arrangement in which the optical output power is monitored using an optical coupler or the like that branches the output light of the LD chip 213, monitoring the light reflected from the end face 223 of the optical fiber 220 not only allows a simple structure but also controls a loss in the optical signal transmitted from the optical transmitting device 200.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical transmitting device comprising:
    a laser diode to which one of a first driving current and a second driving current is provided;
    a controller configured to provide the laser diode with the first driving current to transmit an optical signal and with a plurality of second driving currents, to emit light, different from each other in magnitude during a stop of providing the first driving current;
    a measuring unit configured to measure an intensity of the light emitted by the laser diode;
    a calculator configured to calculate a threshold current of the laser diode, based on the intensities corresponding to the plurality of second driving currents measured by the measuring unit and magnitudes of the plurality of second driving currents; and
    a determination unit configured to determine a precursor of a sudden-death of the laser diode, based on an amount of variation in the threshold current calculated by the calculator during a specific period.

2. The optical transmitting device according to claim 1, wherein the controller provides the laser diode with the first driving current to transmit the optical signal during a first period notified by an optical receiving device as a transmission destination of the optical signal, and provides the laser diode with the plurality of second driving currents during a second period different from the first period.

3. The optical transmitting device according to claim 1,
    wherein the controller provides the laser diode with the first driving current to transmit the optical signal via an optical transmission channel shared with another optical transmitting device, and
    wherein the controller reduces the second driving current in magnitude to be smaller than the first driving current if the duration of the stop of providing the first driving current overlaps at least part of a period throughout which the other optical transmitting device transmits an optical signal via the optical transmission channel.

4. The optical transmitting device according to claim 1, further comprising:
    a plurality of laser diodes,
    wherein the controller switches from a presently used laser diode to another laser diode, among the laser diodes, to which the first driving current is provided if the determination unit has determined on the presently used laser diode that the precursor of the sudden-death is present.

5. The optical transmitting device according to claim 4, wherein the controller switches from the presently used laser diode to the other laser diode, among the laser diodes, to which the first driving current is provided, during the period throughout which the optical signal is not transmitted.

6. The optical transmitting device according to claim 4, further comprising:
    a condenser lens configured to couple light emitted by the plurality of laser diodes to the optical transmission channel through which the optical signal is transmitted.

7. The optical transmitting device according to claim 1, further comprising:
    an optical transmission channel configured to have an end face formed at an angle slant to a direction of the light emitted from the laser diode, and to transmit light entering via the end face out of the light emitted from the laser diode,
    wherein the measuring unit receives light reflected off the end face out of the light emitted from the laser diode and measures an intensity of the light emitted from the laser diode.

8. The optical transmitting device according to claim 4, further comprising:
    an optical transmission channel configured to have an end face formed at an angle slant to a direction of the light emitted from the laser diode, and to transmit light entering via the end face out of the light emitted from the laser diode, wherein the measuring unit receives light reflected off the end face out of the light emitted from the laser diode and measures an intensity of the light emitted from the laser diode.

9. The optical transmitting device according to claim 1, further comprising:
a sensor configured to measure a temperature of the laser diode,
wherein the calculating unit calculates the threshold current that has been corrected in accordance with the temperature measured by the sensor.

10. The optical transmitting device according to claim 4, further comprising:
a sensor configured to measure a temperature of the laser diode,
wherein the calculating unit calculates the threshold current that has been corrected in accordance with the temperature measured by the sensor.

11. The optical transmitting device according to claim 9, wherein the calculating unit calculates the threshold current that has been corrected in accordance with the temperature measured by the sensor and information that indicates in response to the temperature of the laser diode a relationship between a driving current provided to the laser diode and the intensity of the light emitted from the laser diode, the driving current including the first driving current and the second driving current.

12. The optical transmitting device according to claim 10, wherein the calculating unit calculates the threshold current that has been corrected in accordance with the temperature measured by the sensor and information that indicates in response to the temperature of the laser diode a relationship between a driving current provided to the laser diode and the intensity of the light emitted from the laser diode, the driving current including the first driving current and the second driving current.

13. The optical transmitting device according to claim 9, wherein the calculating unit calculates the threshold current that has been corrected in accordance with the temperature measured by the sensor and information that indicates a relationship between the threshold current of the laser diode and the temperature of the laser diode.

14. The optical transmitting device according to claim 10, wherein the calculating unit calculates the threshold current that has been corrected in accordance with the temperature measured by the sensor and information that indicates a relationship between the threshold current of the laser diode and the temperature of the laser diode.

15. An optical transmission system comprising:
an optical receiving device configured to receive an optical signal; and
an optical transmitting device configured to transmit the optical signal to the optical receiving device during a period notified by the optical receiving device, the optical transmitting device including:
a laser diode to which one of a first driving current and a second driving current is provided;
a controller configured to provide the laser diode with the first driving current to transmit the optical signal to the optical receiving device during the period notified by the optical receiving device and with a plurality of second driving currents, to emit light, different from each other in magnitude during a periodic duration different from the period notified by the optical receiving device;
a measuring unit configured to measure an intensity of the light emitted by the laser diode;
a calculator configured to calculate a threshold current of the laser diode, based on the intensities corresponding to the plurality of second driving currents measured by the measuring unit and magnitudes of the plurality of second driving currents; and
a determination unit configured to determine a precursor of a sudden-death of the laser diode, based on an amount of variation in the threshold current calculated by the calculator during a specific period.

16. The optical transmission system according to claim 15, wherein the optical receiving device is arranged at an optical line terminal (OLT), and
wherein the optical transmitting device is arranged at least one of a plurality of optical network units (ONUs), each ONU connected via an optical coupler to the OLT.

* * * * *